US012658798B2

(12) United States Patent
Yuruki et al.

(10) Patent No.: US 12,658,798 B2
(45) Date of Patent: Jun. 16, 2026

(54) SIGNAL GENERATION CIRCUIT, SWITCHING DEVICE, AND SWITCHING POWER SUPPLY DEVICE

(71) Applicant: ROHM CO., LTD., Kyoto (JP)

(72) Inventors: Daichi Yuruki, Kyoto (JP); Kazuhiro Murakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 236 days.

(21) Appl. No.: 18/392,460

(22) Filed: Dec. 21, 2023

(65) Prior Publication Data

US 2024/0162817 A1 May 16, 2024

Related U.S. Application Data

(63) Continuation of application No. PCT/JP2022/021398, filed on May 25, 2022.

(30) Foreign Application Priority Data

Jul. 16, 2021 (JP) ................................. 2021-117614

(51) Int. Cl.
*H02M 3/158* (2006.01)
*H02M 1/00* (2006.01)
(Continued)

(52) U.S. Cl.
CPC ......... *H02M 3/158* (2013.01); *H02M 1/0025* (2021.05); *H02M 1/44* (2013.01); *H03K 4/06* (2013.01)

(58) Field of Classification Search
CPC ............. H02M 1/0003; H02M 1/0009; H02M 1/0012; H02M 1/0019; H02M 1/0025;
(Continued)

(56) References Cited

U.S. PATENT DOCUMENTS

2009/0261797 A1* 10/2009 Shibata ................... H02M 1/36
                                                              323/288
2017/0093313 A1* 3/2017 Brown ..................... H02P 27/08
(Continued)

FOREIGN PATENT DOCUMENTS

JP        2001-013233        1/2001
JP        2004266780 A   *   9/2004
(Continued)

OTHER PUBLICATIONS

International Search Report and Written Opinion in International Appln. No. PCT/JP2022/021398, mailed on Jul. 19, 2022, 14 pages (with machine translation).
(Continued)

*Primary Examiner* — Thienvu V Tran
*Assistant Examiner* — Shahzeb K Ahmad
(74) *Attorney, Agent, or Firm* — Fish & Richardson P.C.

(57) ABSTRACT

A signal generation circuit includes: a reference voltage generation circuit configured to generate a reference voltage; a ramp voltage generation circuit configured to generate a ramp voltage that varies within a predetermined voltage range; and a comparison circuit configured to output a comparison result signal that indicates the magnitude relationship between the reference voltage and the ramp voltage. The reference voltage generation circuit gives the reference voltage a waveform of a triangular wave and varies the frequency of the triangular wave.

14 Claims, 14 Drawing Sheets

(51) Int. Cl.
H02M 1/44 (2007.01)
H03K 4/06 (2006.01)

(58) Field of Classification Search
CPC ............. H02M 1/0032; H02M 1/0035; H02M 1/0041; H02M 1/0054; H02M 3/156; H02M 3/157; H02M 3/158; H02M 3/1582; H02M 3/1584; H02M 3/335; H02M 3/33507; H03K 4/06
See application file for complete search history.

(56) References Cited

U.S. PATENT DOCUMENTS

| | | | | |
|---|---|---|---|---|
| 2017/0373596 A1* | 12/2017 | Huang | .................. | H02M 3/158 |
| 2020/0076310 A1* | 3/2020 | Takenaka | .............. | H02M 3/158 |

FOREIGN PATENT DOCUMENTS

| | | | | |
|---|---|---|---|---|
| JP | 2014-230210 | 12/2014 | | |
| JP | 2017-060383 | 3/2017 | | |
| KR | 20150137323 A | * 12/2015 | ............ | H02M 3/158 |

OTHER PUBLICATIONS

JP OA—Japanese Patent Office, Office Action in Japanese Appln. No. 2023-535161, dated May 12, 2026, 6 pages (with English Translation).

* cited by examiner

<u>1ST PATTERN</u>

1ST RAMP UNIT
OPERATION

2ND PATTERN

FIG.12
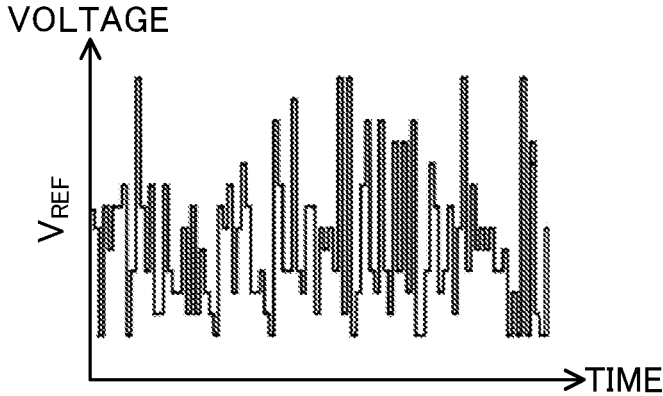
FIG.13
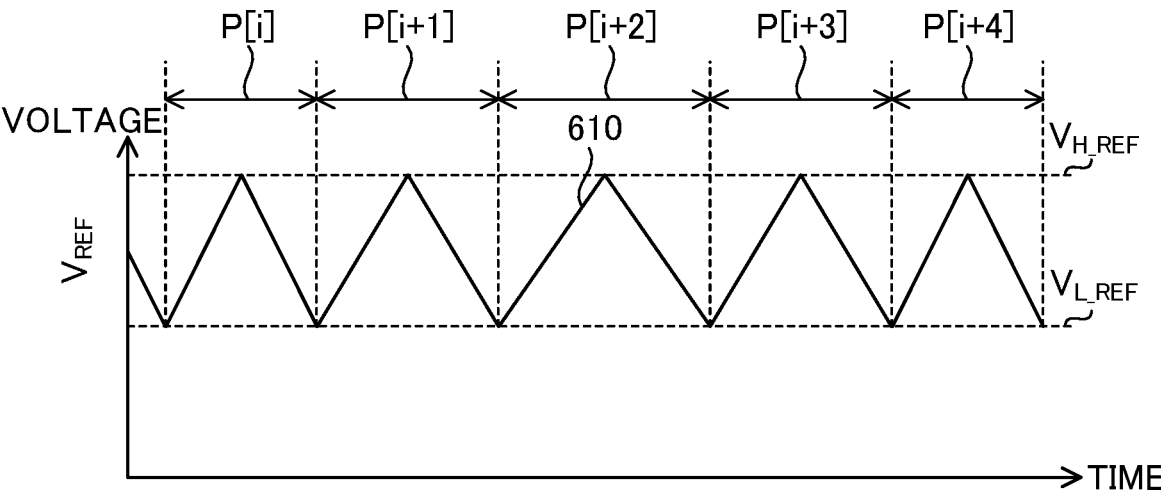
FIG.14
$$T[1] \rightarrow T[2] \rightarrow T[3] \rightarrow \cdots \rightarrow T[n-1] \rightarrow T[n]$$
$$T[2] \leftarrow T[3] \leftarrow \cdots \leftarrow T[n-1]$$
$$T[1] < T[2] < T[3] \quad \cdots \quad < T[n-1] < T[n]$$

SIGNAL GENERATION CIRCUIT, SWITCHING DEVICE, AND SWITCHING POWER SUPPLY DEVICE

CROSS-REFERENCE TO RELATED APPLICATIONS

This nonprovisional application is a continuation application of International Patent Application No. PCT/JP2022/021398 filed on May 25, 2022, which claims priority Japanese Patent Application No. 2021-117614 filed on Jul. 16, 2021, the entire contents of which are hereby incorporated by reference.

TECHNICAL FIELD

The present disclosure relates to signal generation circuits, switching devices, and switching power supply devices.

BACKGROUND ART

Increasing the frequency of a signal used in a circuit often leads to increased noise. For example, in a switching power supply device, downsizing of the circuit may be attempted by increasing the switching frequency but increasing the switching frequency leads to increased conduction and radiation noise. An example of a switching power supply device is one disclosed in Patent Document 1 identified below.

The spread spectrum technology is known as a technology for suppressing the effects of noise. The spread spectrum technology permits noise to be diffused over a wide band, and this helps suppress the practical effects of the noise.

CITATION LIST

Patent Literature

Patent Document 1: JP-A-2017-060383

BRIEF DESCRIPTION OF DRAWINGS

FIG. 12 is a diagram showing the time dependence of a reference voltage according to Reference Example 3.

FIG. 13 is a diagram showing the waveform of a reference voltage according to Practical Example EX1_A belonging to a first embodiment of the present disclosure.

FIG. 14 is a diagram showing how the period of a triangular wave in a reference voltage varies cyclically according to Practical Example EX1_A belonging to the first embodiment of the present disclosure.

DESCRIPTION OF EMBODIMENTS

Figure 1:
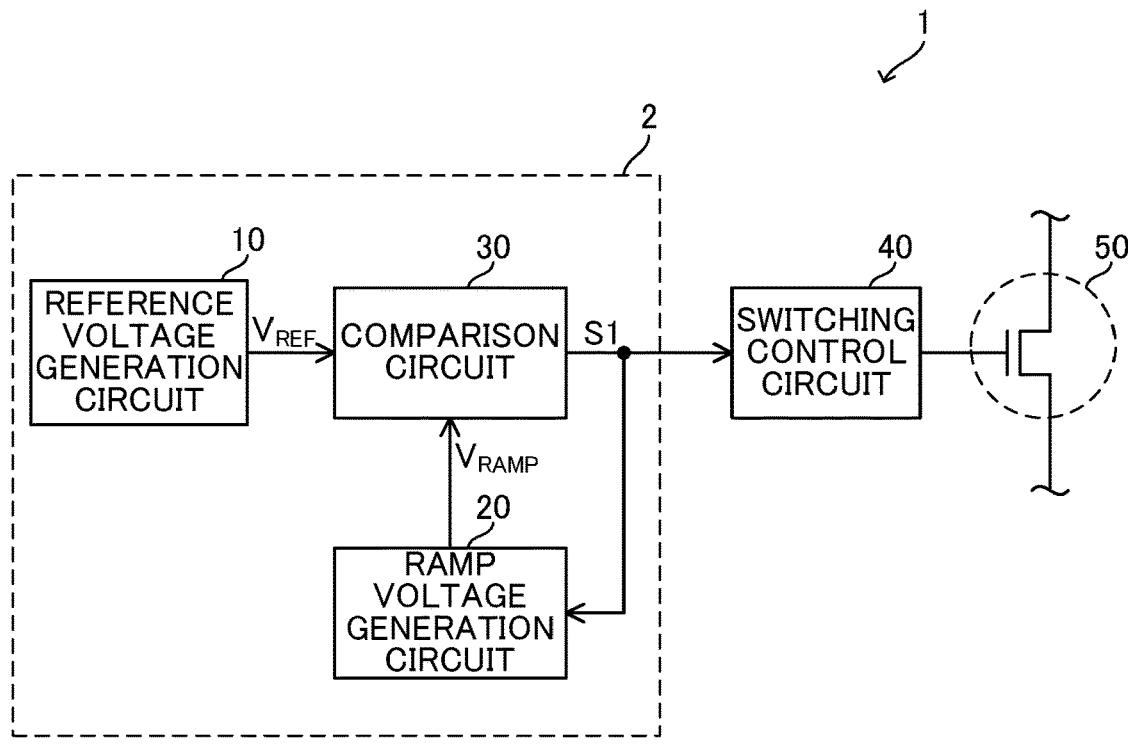
FIG. 1 is a configuration diagram of a switching device according to a first embodiment of the present disclosure.

Examples of implementing the present disclosure will be specifically described below with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the switching transistor described later and identified by the reference sign "50" (see FIG. 1) is sometimes referred to as "switching transistor 50" and other times abbreviated to "transistor 50", both referring to the same entity.

First, some of the terms used to describe embodiments of the present disclosure will be defined. "Ground" denotes a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" is a potential higher than "low level". Any digital signal takes high or low level as its signal level. For any signal or voltage of interest, its being at high level means, more precisely, its level being equal to high level, and its being at low level means, more precisely, its level being equal to low level. A level with respect to a signal is occasionally referred to as a signal level, and a level with respect to a voltage is occasionally referred to as a voltage level. For any signal or voltage, a transition from low level to high level is termed an up edge (or rising edge), and the timing of a transition from low level to high level is termed an up-edge timing (or rising-edge timing). Likewise, for any signal or voltage, a transition from high level to low level is termed a down edge (or falling edge), and the timing of a transition from high level to low level is termed a down-edge timing (or falling-edge timing).

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply to any transistor that is not classified as an FET. Unless otherwise stated, any MOSFET can be understood to be an enhancement MOSFET. "MOSFET" is an abbreviation of "metal-oxide-semiconductor field-effect transistor". In the following description, for any transistor, its being in the on or off state is occasionally expressed simply as its being on or off respectively. For any transistor, a transition from the off state to the on state is referred to as a turning-on, and a transition from the on state to the off state is referred to as a turning-off. For any transistor, a period in which it is in the on state is often referred to as the on period, and a period in which it is in the off state is often referred to as the off period.

For any signal that takes as its signal level high level or low level, the period in which the signal is at high level is referred to as the high-level period and the period in which the signal is at low level is referred to as the low-level period. The same applies to any voltage that takes as its voltage level high level or low level.

Unless otherwise stated, wherever "connection" is discussed among a plurality of parts constituting a circuit, as among given circuit elements, wirings (lines), nodes, and the like, the term is to be understood to denote "electrical connection".

First Embodiment

A first embodiment of the present disclosure will be described. FIG. 1 is a configuration diagram of a switching device 1 according to the first embodiment of the present disclosure. The switching device 1 includes a reference voltage generation circuit 10, a ramp voltage generation circuit 20, a comparison circuit 30, a switching control circuit 40, and a switching transistor 50. The switching device 1 includes a signal generation circuit 2, which can be called a spread-spectrum signal generation circuit. The signal generation circuit 2 is constituted by the reference voltage generation circuit 10, the ramp voltage generation circuit 20, and the comparison circuit 30.

The reference voltage generation circuit 10 generates and outputs a reference voltage $V_{REF}$. The reference voltage $V_{REF}$ has a waveform of a triangular wave, and this will be discussed later. The ramp voltage generation circuit 20 generates and outputs a ramp voltage $V_{RAMP}$ that varies within a predetermined voltage range. The reference voltage $V_{REF}$ and the ramp voltage $V_{RAMP}$ are fed to the comparison circuit 30. The comparison circuit 30 compares the reference voltage $V_{REF}$ and the ramp voltage $V_{RAMP}$ to generate and output, as a comparison result signal, a signal S1 that indicates the magnitude relationship between the reference voltage $V_{REF}$ and the ramp voltage $V_{RAMP}$. The signal S1 is fed to the switching control circuit 40. Based on the signal S1, the switching control circuit 40 switches the switching transistor 50. As the switching transistor 50 is switched, its state switches between an on state and an off state. The signal S1 is fed also to the ramp voltage generation circuit 20.

In FIG. 1, the switching transistor 50 is shown to be an N-channel MOSFET. The switching transistor 50 may instead be a transistor of any type. Specifically, the switching transistor 50 may be either an N-channel MOSFET or a P-channel MOSFET. The switching transistor 50 may be a bipolar transistor, a junction FET, or an IGBT (insulated-gate bipolar transistor). The following description of this embodiment assumes that the switching transistor 50 is an N-channel MOSFET. The switching control circuit 40 can turn the switching transistor 50 on or off by controlling the gate potential of the switching transistor 50 (in other words, by controlling the gate-source voltage of the switching transistor 50).

The signal S1 is a binary signal (digital signal) that takes either the value "0" or the value "1". It is here assumed that the signal S1 has positive logic. Accordingly, it is assumed that the signal S1 takes, as its signal level, either high level or low level, a low-level signal S1 indicating the value "0" and a high-level signal S1 indicating the value of "1". A modification is however possible where the signal S1 has negative logic.

The switching device 1 can operate with a first pattern or a second pattern as described below.

[First Pattern]

Figure 2:
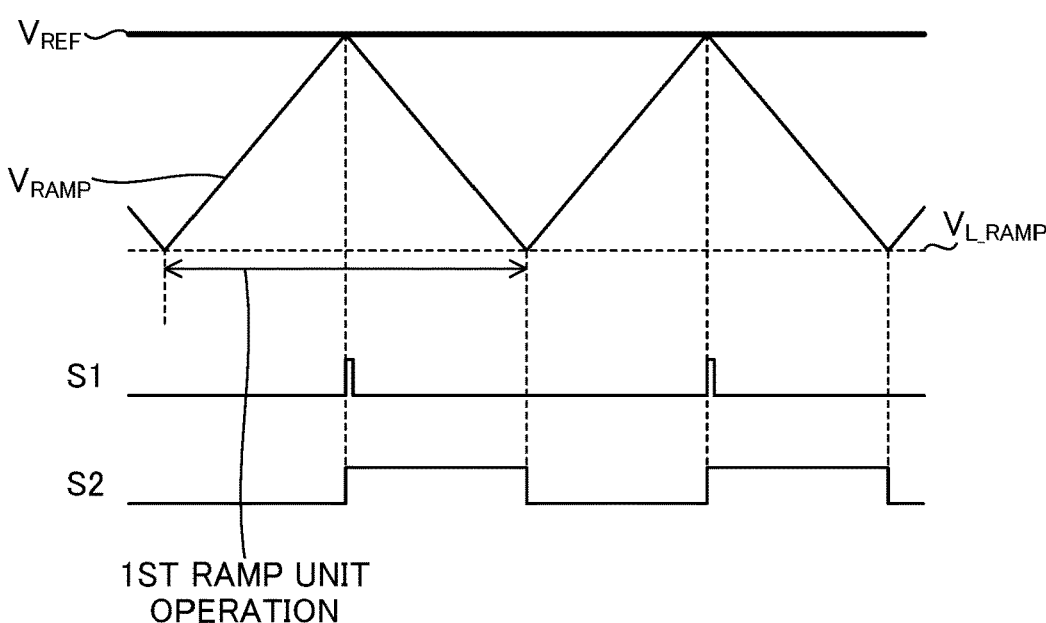
FIG. 2 is a diagram showing a relationship among a plurality of voltages and signals in a first pattern according to the first embodiment of the present disclosure.

FIG. 2 shows the relationship among the reference voltage $V_{REF}$, the ramp voltage $V_{RAMP}$, and the signal S1 in the first pattern. FIG. 2 also shows a signal S2, which will be described later. Although, as mentioned above, the reference voltage $V_{REF}$ has a waveform of a triangular wave, seeing that the frequency of the reference voltage $V_{REF}$ (in other words, the frequency of the triangular wave in the reference voltage $V_{REF}$) is far lower than the frequency of the ramp voltage $V_{RAMP}$, FIG. 2 shows the relevant voltage waveforms as if the reference voltage $V_{REF}$ had a constant value (the same is true also with FIG. 3, which will be referred to later).

With the first pattern, the comparison circuit 30 keeps the signal S1 at low level (i.e., gives the signal S1 the value "0") if the ramp voltage $V_{RAMP}$ is lower than the reference voltage $V_{REF}$ and keeps the signal S1 at high level (i.e., gives the signal S1 the value "1") if the ramp voltage $V_{RAMP}$ is higher than the reference voltage $V_{REF}$. Accordingly, with the first pattern, the comparison circuit 30 generates an up edge in the signal S1 (i.e., changes the value of the signal S1 from "0" to "1") when the ramp voltage $V_{RAMP}$ transits from a state lower than the reference voltage $V_{REF}$ (i.e., a state where $V_{RAMP} < V_{REF}$) to a state where the ramp voltage $V_{RAMP}$ is higher than the reference voltage $V_{REF}$ (i.e., a state where $V_{RAMP} > V_{REF}$). If the reference voltage $V_{REF}$ and the ramp voltage $V_{RAMP}$ are just equal, the signal S1 is at low level or high level.

With the first pattern, the ramp voltage generation circuit 20 repeatedly performs first ramp unit operation as described below to generate the ramp voltage $V_{RAMP}$ shown in FIG. 2. In the first ramp unit operation, starting in a state where the ramp voltage $V_{RAMP}$ is made equal to a predetermined lower-limit voltage $V_{L\_RAMP}$, the ramp voltage generation circuit 20 increases the ramp voltage $V_{RAMP}$ linearly and monotonically from the lower-limit voltage $V_{L\_RAMP}$ with a predetermined increase gradient $U_{\_RAMP}$; when an up edge occurs in the signal S1 (when the value of the signal S1 changes from "0" to "1"), at the up edge timing of the signal S1, the ramp voltage generation circuit 20 reverses the direction of change of the ramp voltage $V_{RAMP}$ from an increasing direction to a decreasing direction; after that, the ramp voltage generation circuit 20 decreases the ramp voltage $V_{RAMP}$ linearly and monotonically toward the lower-limit voltage $V_{L\_RAMP}$ with a predetermined decrease gradient $D_{\_RAMP}$. In the ith cycle of the first ramp unit operation, when as a result of the monotonic decrease described above, the ramp voltage $V_{RAMP}$ falls to the lower-limit voltage $V_{L\_RAMP}$, the ramp voltage generation circuit 20 ends the ith cycle of the first ramp unit operation and subsequently starts the (i+1)th cycle of the first ramp unit operation. The increase and decrease gradients U RAMP and $D_{\_RAMP}$ are constant. Here, the symbol "i" represents any natural number. The magnitudes of the increase and decrease gradients $U_{\_RAMP}$ and $D_{\_RAMP}$ may be equal.

As the first ramp unit operation is repeated with the first pattern, every time the ramp voltage $V_{RAMP}$ reaches the reference voltage $V_{REF}$, an up edge occurs in the signal S1. The fulfillment of $V_{RAMP} > V_{REF}$, hence the turning of the signal S1 to high level, is quickly followed by a transition from the state where $V_{RAMP} > V_{REF}$ to the state where $V_{RAMP} < V_{REF}$, and thus the high-level period of the signal S1 is minimally short. That is, a minimally short time after an up edge in the signal S1, a down edge occurs in the signal S1.

Here, the lower-limit voltage $V_{L\_RAMP}$ is lower than the lower limit of the range of variation of the reference voltage $V_{REF}$ (FIG. 2 does not show how the reference voltage $V_{REF}$ varies). Thus, in each cycle of the first ramp unit operation performed repeatedly, an up edge occurs in the signal S1 without fail.

In the switching device 1 (e.g., in the switching control circuit 40) with the first pattern, a signal S2 as shown in FIG. 2 may be generated based on the signal S1 and the ramp voltage $V_{RAMP}$ Like the signal S1, the signal S2 takes, as its signal level, low level or high level. With the first pattern, synchronously with an up edge in the signal S1, an up edge occurs in the signal S2; after that, in response to, as a result of the monotonic decrease of the ramp voltage $V_{RAMP}$, the ramp voltage $V_{RAMP}$ falling to the lower-limit voltage $V_{L\_RAMP}$, a down edge occurs in the signal S2.

[Second Pattern]

Figure 3:
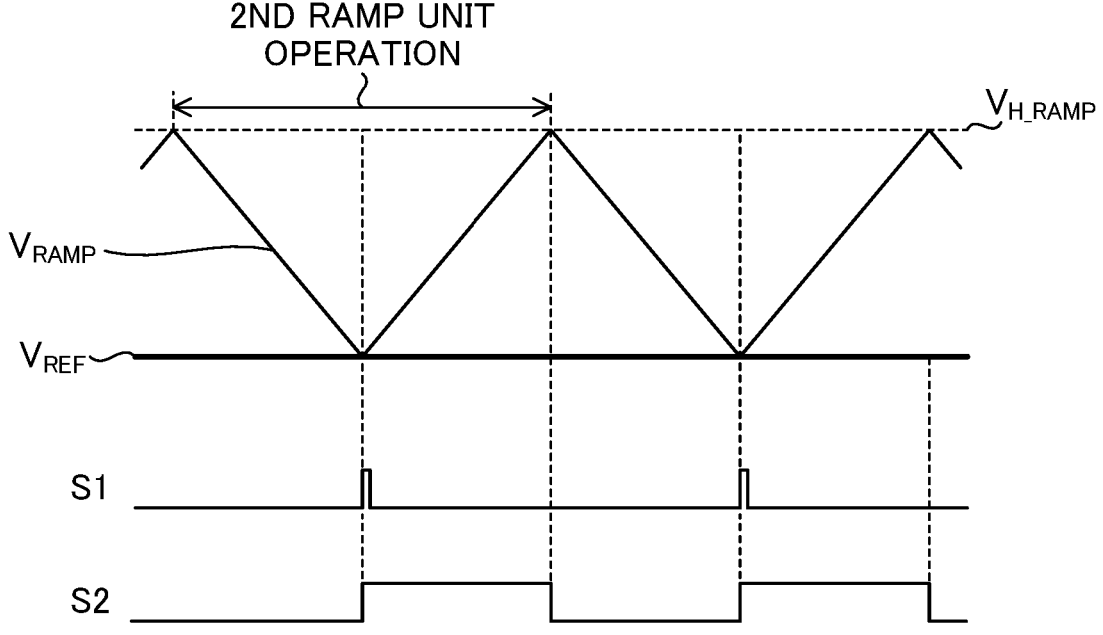
FIG. 3 is a diagram showing a relationship among a plurality of voltages and signals in a second pattern according to the first embodiment of the present disclosure.

FIG. 3 shows the relationship among the reference voltage $V_{REF}$, the ramp voltage $V_{RAMP}$, and the signal S1 in the second pattern. FIG. 3 also shows a signal S2, which will be described later.

With the second pattern, the comparison circuit 30 keeps the signal S1 at low level (i.e., gives the signal S1 the value "0") if the ramp voltage $V_{RAMP}$ is higher than the reference voltage $V_{REF}$ and keeps the signal S1 at high level (i.e., gives the signal S1 the value "1") if the ramp voltage $V_{RAMP}$ is lower than the reference voltage $V_{REF}$. Accordingly, with the second pattern, the comparison circuit 30 generates an up edge in the signal S1 (i.e., changes the value of the signal S1 from "0" to "1") when the ramp voltage $V_{RAMP}$ transits from a state higher than the reference voltage $V_{REF}$ (i.e., a state where $V_{RAMP} > V_{REF}$) to a state where the ramp voltage $V_{RAMP}$ is lower than the reference voltage $V_{REF}$ (i.e., a state where $V_{RAMP} < V_{REF}$). If the reference voltage $V_{REF}$ and the ramp voltage $V_{RAMP}$ are just equal, the signal S1 is at low level or high level.

With the second pattern, the ramp voltage generation circuit 20 repeatedly performs second ramp unit operation as described below to generate the ramp voltage $V_{RAMP}$ shown in FIG. 3. In the second ramp unit operation, starting in a state where the ramp voltage $V_{RAMP}$ is made equal to a predetermined upper-limit voltage $V_{H\_RAMP}$, the ramp voltage generation circuit 20 decreases the ramp voltage $V_{RAMP}$ linearly and monotonically from the upper-limit voltage $V_{H\_RAMP}$ with a predetermined decrease gradient $D_{\_RAMP}$; when an up edge occurs in the signal S1 (when the value of the signal S1 changes from "0" to "1"), at the up-edge timing of the signal S1, the ramp voltage generation circuit 20 reverses the direction of change of the ramp voltage $V_{RAMP}$ from a decreasing direction to an increasing direction; after that, the ramp voltage generation circuit 20 increases the ramp voltage $V_{RAMP}$ linearly and monotonically toward the upper-limit voltage $V_{H\_RAMP}$ with a predetermined increase gradient U RAMP. In the ith cycle of the second ramp unit operation, when as a result of the monotonic increase described above, the ramp voltage $V_{RAMP}$ reaches the upper-limit voltage $V_{H\_RAMP}$, the ramp voltage generation circuit 20 ends the i-th cycle of the second ramp unit operation and subsequently starts the (i+1)th cycle of the second ramp unit operation.

As the second ramp unit operation is repeated with the second pattern, every time the ramp voltage $V_{RAMP}$ falls to the reference voltage $V_{REF}$, an up edge occurs in the signal S1. The fulfillment of $V_{RAMP} < V_{REF}$, hence the turning of the signal S1 to high level, is quickly followed by a transition from the state where $V_{RAMP} < V_{REF}$ to the state where $V_{RAMP} > V_{REF}$, and thus the high-level period of the signal S1 is minimally short. That is, a minimally short time after an up edge in the signal S1, a down edge occurs in the signal S1.

Here, the upper-limit voltage $V_{H\_RAMP}$ is higher than the upper limit of the range of variation of the reference voltage $V_{REF}$ (FIG. 3 does not show how the reference voltage $V_{REF}$ varies). Thus, in each cycle of the second ramp unit operation performed repeatedly, an up edge occurs in the signal S1 without fail.

In the switching device 1 (e.g., in the switching control circuit 40) with the second pattern, a signal S2 as shown in FIG. 3 may be generated based on the signal S1 and the ramp voltage $V_{RAMP}$ Like the signal S1, the signal S2 takes, as its signal level, low level or high level. With the second pattern, synchronously with an up edge in the signal S1, an up edge occurs in the signal S2; after that, in response to, as a result of the monotonic increase of the ramp voltage $V_{RAMP}$, the ramp voltage $V_{RAMP}$ reaching the upper-limit voltage $V_{H\_RAMP}$, a down edge occurs in the signal S2.

[Operation of the Switching Control Circuit]

The switching control circuit 40 operates in the same manner with the first and second patterns described above: at an up edge in the signal S1 (in other words, synchronously with a up edge in the signal S1), the switching control circuit 40 turns the switching transistor 50 on or off (switches the switching transistor 50 from off to on or switches the switching transistor 50 from on to off).

In the case where the switching control circuit 40 turns the switching transistor 50 on in response to an up edge in the signal S1, the switching control circuit 40 thereafter turns off the switching transistor 50 in response to the fulfillment of a predetermined condition. In the case where the switching control circuit 40 turns the switching transistor 50 off in response to an up edge in the signal S1, the switching control circuit 40 thereafter turns on the switching transistor 50 in response to the fulfillment of a predetermined condition. In this way, the switching control circuit 40 performs switching operation so as to change the state of the switching transistor 50 from one to the other of the on and off states in response to a particular change in the signal S1 (a change of the value of the signal S1 from "0" to "1") and thereafter, on fulfilment of a predetermined condition, change the state of the switching transistor 50 from the other back to one of the on and off states. This switching operation is performed every time the particular change mentioned above occurs. Accordingly, the switching operation is performed repeatedly at intervals equal to the reciprocal of the frequency of the signal S1.

Any condition may be used as the predetermined condition mentioned above. For example, a change of the value of a predetermined digital signal generated separately from the signal S1 from "0" to "1" may be taken to fulfill the predetermined condition mentioned above. This digital signal is generated within the switching control circuit 40, or is fed to the switching control circuit 40 from a circuit not illustrated. For another example, a down edge occurring in the signal S2 may be taken to fulfill the predetermined condition mentioned above. For yet another example, the lapse of a predetermined time Δt after an up-edge timing of the signal S1 may be taken to fulfill the predetermined condition mentioned above.

The reference voltage generation circuit 10 generates the reference voltage $V_{REF}$ with a distinctive waveform. Before a description of the actual waveform of the reference voltage $V_{REF}$, Reference Examples 1 to 3 will be described. In the following description, the frequency of the signal S1 is occasionally referred to as the frequency $f_{S1}$. The frequency $f_{S1}$ corresponds to the reciprocal of the intervals at which up edges occur in the signal S1.

Reference Example 1

Figure 4:
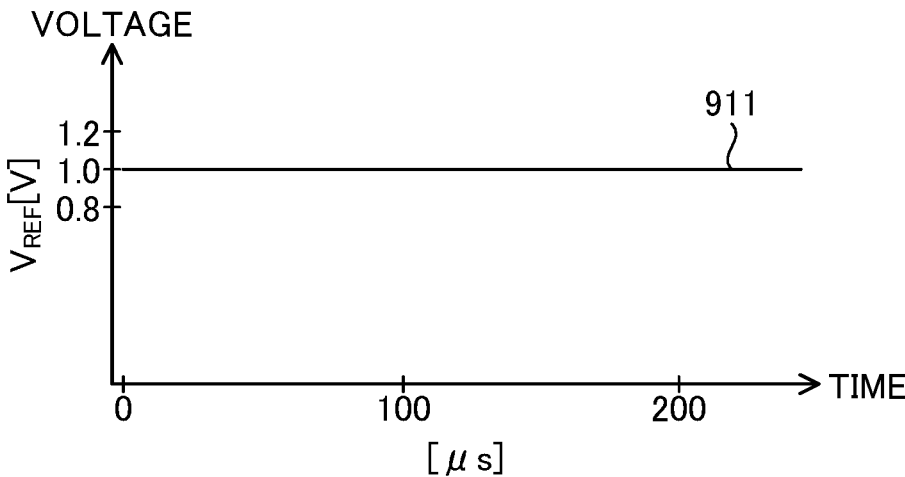
FIG. 4 is a diagram showing the time dependence of a reference voltage according to Reference Example 1.
Figure 5:
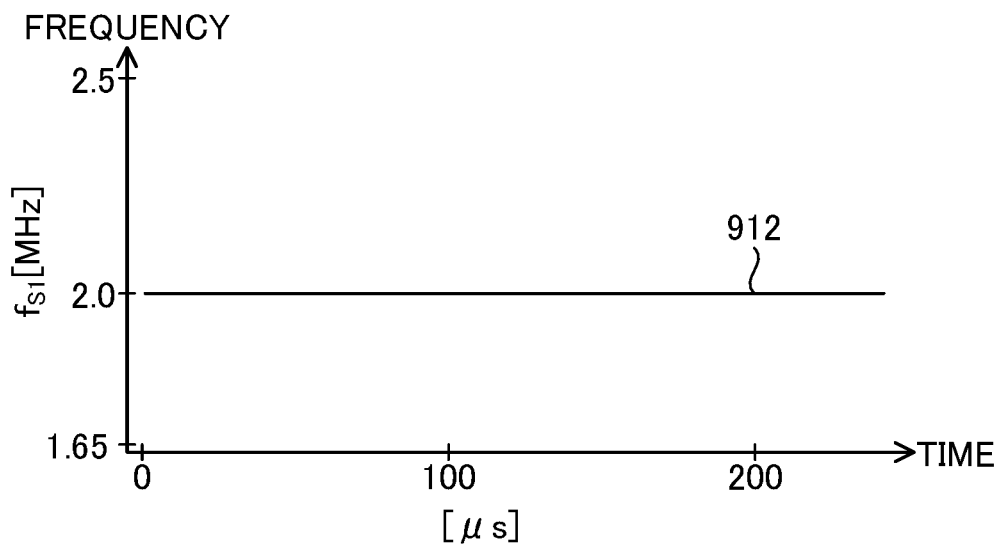
FIG. 5 is a diagram showing the time dependence of the frequency of a comparison result signal according to Reference Example 1.
Figure 6:
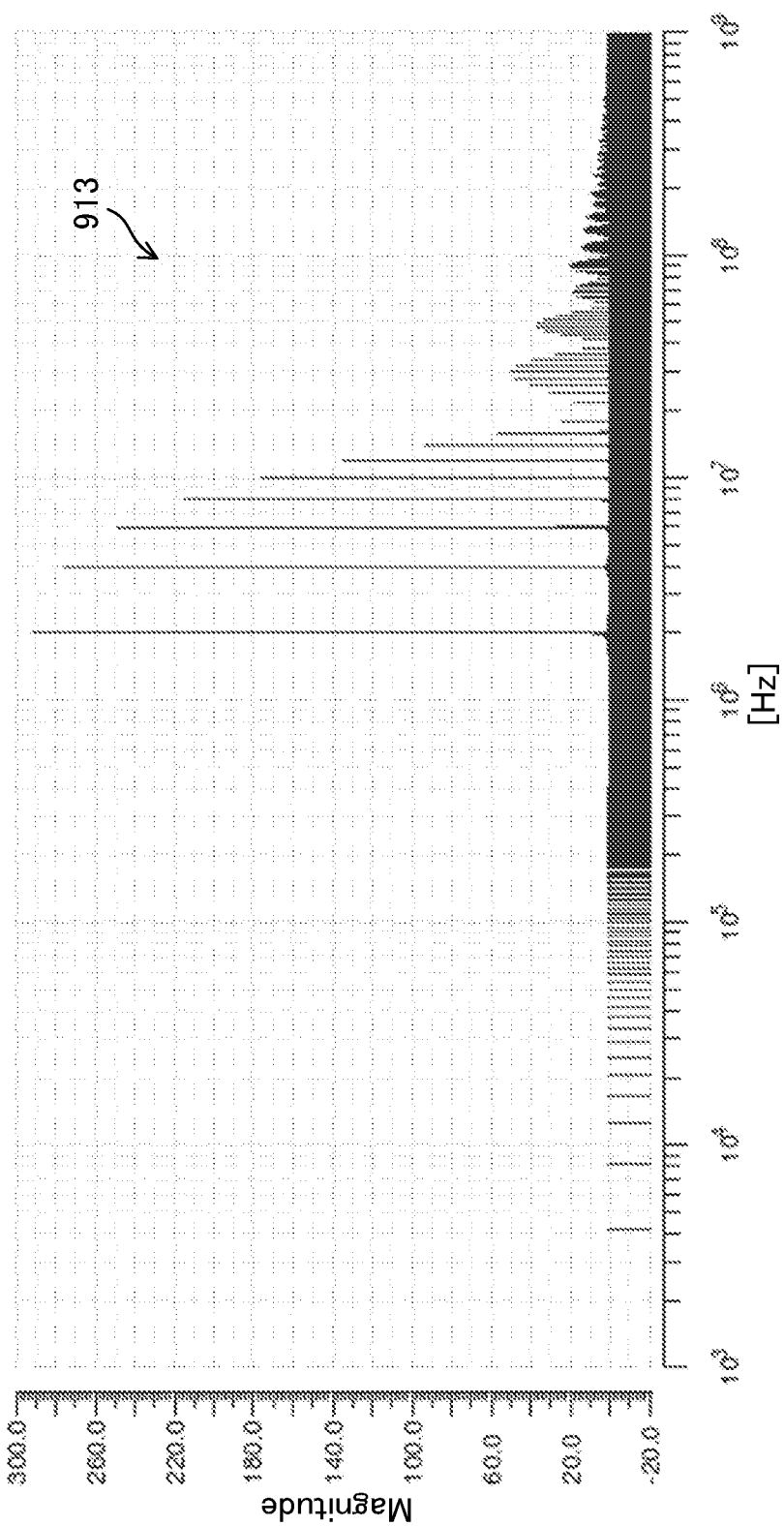
FIG. 6 is a diagram showing the frequency spectrum of a comparison result signal according to Reference Example 1.

In Reference Example 1, the reference voltage $V_{REF}$ is fixed at a constant voltage. Accordingly, in Reference Example 1, also the frequency $f_{S1}$ of the signal S1 is fixed to be constant. In FIG. 4, a waveform 911 represents the time dependence of the reference voltage $V_{REF}$ in Reference Example 1 and, in FIG. 5, a waveform 912 represents the time dependence of the frequency $f_{S1}$ of the signal S1 in Reference Example 1. Here, in Reference Example 1, the reference voltage $V_{REF}$ is fixed at 1.0 V (volt) and the frequency $f_{S1}$ of the signal S1 is fixed at 2.0 MHz. Not only in Reference Example 1, this embodiment assumes the following: the characteristics (increase gradient $U_{\_RAMP}$, decrease gradient $D_{\_RAMP}$, lower-limit voltage $V_{L\_RAMP}$, and upper-limit voltage $V_{H\_RAMP}$ mentioned above) of the ramp voltage generation circuit 20 are so determined that, if the reference voltage $V_{REF}$ is fixed at 1.0 V, the frequency $f_{S1}$ is fixed at 2.0 MHz. FIG. 6 shows the frequency spectrum of the signal S1 in Reference Example 1. In Reference Example 1, the signal S1 has high-intensity signal components at the frequency of 2.0 MHz as well as at frequencies that are integer multiples of that frequency. This means that high conduction and radiation noise are generated at those frequencies. Many devices do not tolerate high conduction and radiation noise.

Reference Example 2

In Reference Example 2, the reference voltage $V_{REF}$ is a voltage with a triangular waveform and a constant frequency. The frequency of this triangular wave is significantly lower than the frequency $f_{S1}$ of the signal S1. Accordingly, in Reference Example 2, the frequency $f_{S1}$ of the signal S1 varies as the reference voltage $V_{REF}$ varies.

Figure 7:
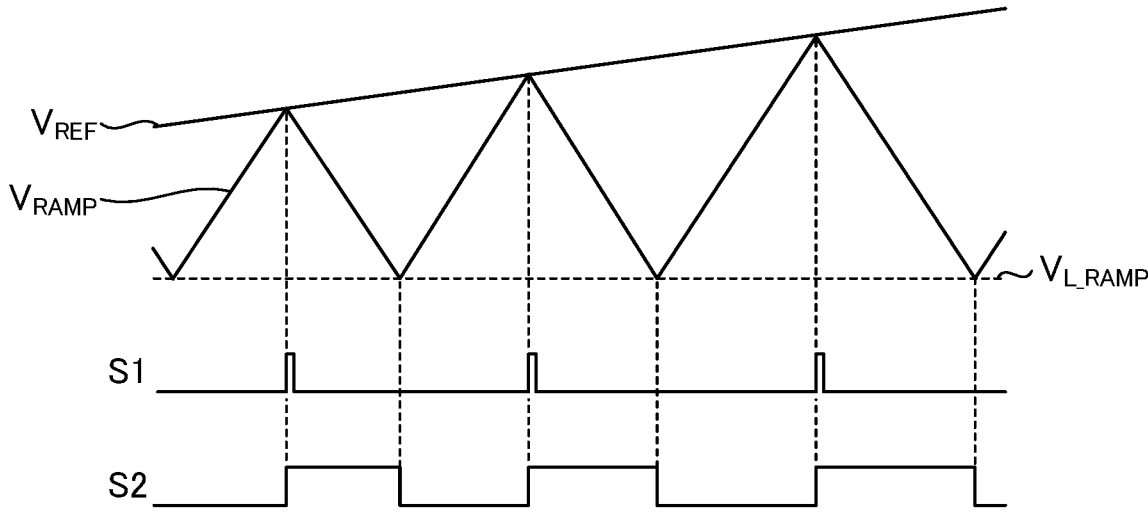
FIG. 7 is a diagram showing the relationship among a reference voltage, a ramp voltage, and a plurality of signals, with the reference voltage in the process of increasing.
Figure 8:
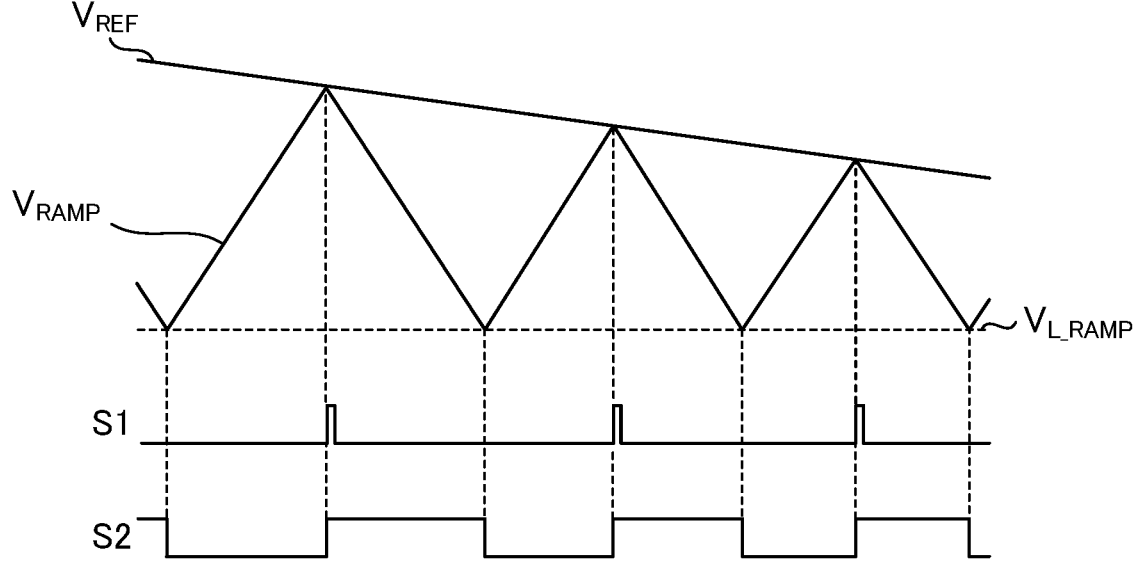
FIG. 8 is a diagram showing the relationship among a reference voltage, a ramp voltage, and a plurality of signals, with the reference voltage in the process of decreasing.

FIG. 7 schematically shows, for a case where the first pattern (see FIG. 2) described above is employed, the waveforms of the relevant voltages and signals as observed with the reference voltage $V_{REF}$ in the process of increasing within a single triangular wave. With the reference voltage $V_{REF}$ in the process of increasing within a single triangular wave, the intervals of occurrence of up edges in the signal S1 gradually increases (i.e., the frequency $f_{S1}$ of the signal S1 gradually increases). FIG. 8 schematically shows, for a case where the first pattern (see FIG. 2) described above is employed, the waveforms of the relevant voltages and signals as observed with the reference voltage $V_{REF}$ in the process of decreasing within a single triangular wave. With the reference voltage $V_{REF}$ in the process of decreasing within a single triangular wave, the intervals of occurrence of up edges in the signal S1 gradually decreases (i.e., the frequency $f_{S1}$ of the signal S1 gradually decreases). This results in reduced peak intensities of the signal S1 around the frequency of the signal S1.

Figure 9:
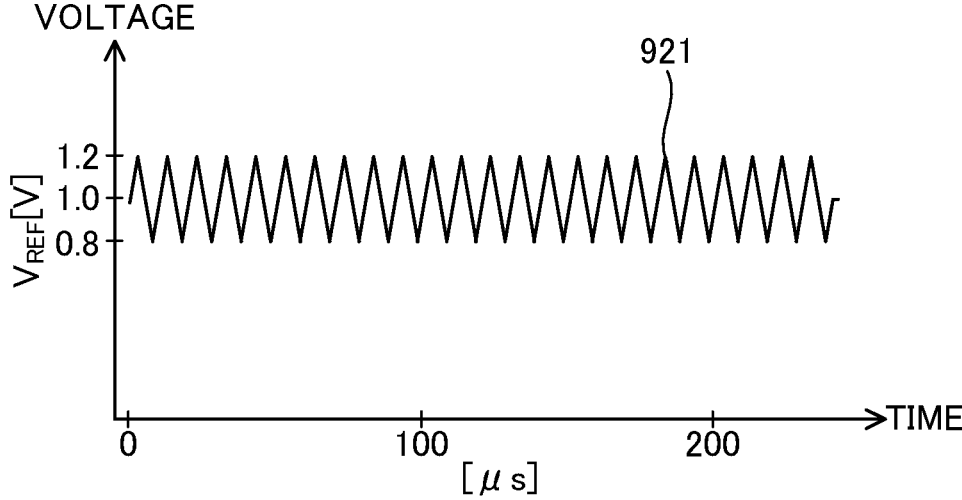
FIG. 9 is a diagram showing the time dependence of a reference voltage according to Reference Example 2.
Figure 10:
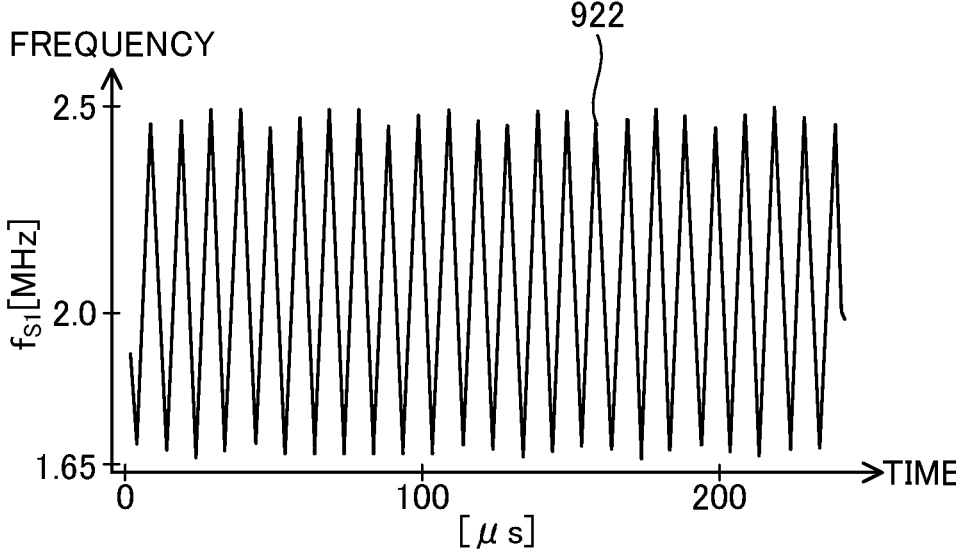
FIG. 10 is a diagram showing the time dependence of the frequency of a comparison result signal according to Reference Example 2.

In FIG. 9, a waveform 921 represents the time dependence of the reference voltage $V_{REF}$ in Reference Example 2 and, in FIG. 10, a waveform 922 represents the time dependence of the frequency $f_{S1}$ of the signal S1 in Reference Example 2. It is here assumed that, in Reference Example 2, the reference voltage $V_{REF}$ is a voltage with a triangular waveform that varies around 1.0 V (volts) between 0.8 V and 1.2 V, and that the frequency of the triangular wave is fixed at 100 kHz (kilohertz). Thus, in Reference Example 2, the frequency $f_{S1}$ of the signal S1 varies around 2.0 MHz.

Figure 11:
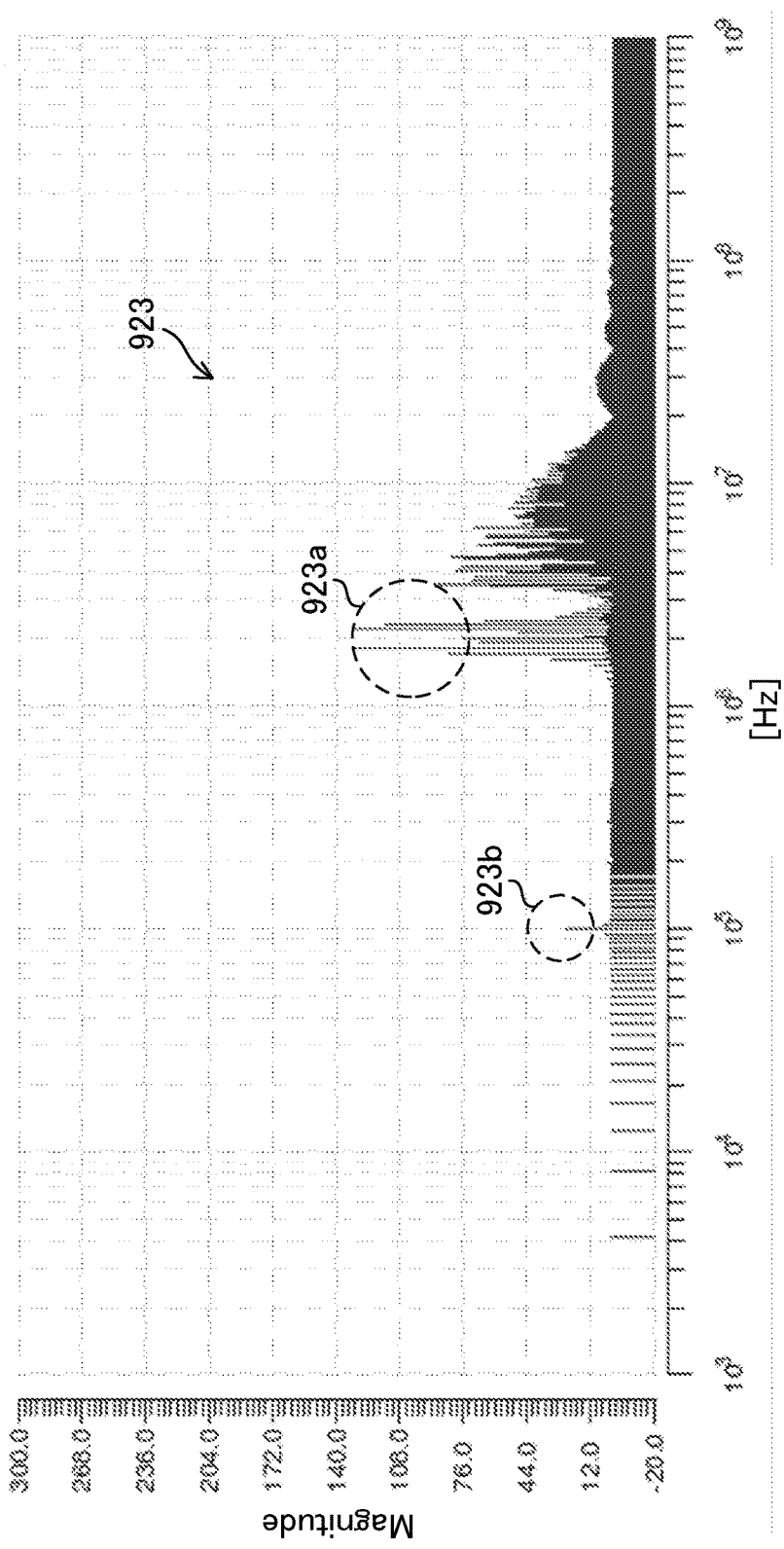
FIG. 11 is a diagram showing the frequency spectrum of a comparison result signal according to Reference Example 2.

FIG. 11 shows the frequency spectrum 923 of the signal S1 in Reference Example 2. It reveals that, compared with Reference Example 1, in Reference Example 2, the spectrum of the signal S1 is spread, resulting in reduced peak intensities of the signal S1 in a high-frequency band (its peak intensities at 2.0 MHz and at frequencies that are integer multiples of 2.0 MHz; see the broken line-encircled part 923a). It should however be noted that, in Reference Example 2, the signal S1 has a high intensity in the frequency band of the modulation of the reference voltage $V_{REF}$ (corresponding to the broken line-encircled part 923b). The frequency band of the modulation of the reference voltage $V_{REF}$ (here, a band around 100 kHz) is a low-frequency band lower than the 2 MHz band, and noise in such a low-frequency band may have adverse effects on a device that uses the signal S1, a device that uses a signal containing the signal S1, or a device that uses a signal based on the signal S1.

One example of a device that uses the signal S1 is a radar device that is mounted on a vehicle such as an automobile (hereinafter referred to as a vehicle-mounted radar device). A vehicle-mounted radar device can sense the distance from a vehicle to an object located outside the vehicle, the speed of the object (the relative speed between the vehicle and the object), and the like. High noise in a low-frequency band may have adverse effects on the sensing accuracy of the vehicle-mounted radar device.

Reference Example 3

Also considered is a method (referred to as Reference Example 3) that uses as the reference voltage $V_{REF}$ a voltage (see FIG. 12) that varies discretely in accordance with random numbers. With Reference Example 3, however, since the reference voltage $V_{REF}$ does not vary stepwise, the circuit may not operate with satisfactory response and may not function as desired. Or the circuit may need to be modified to operate faster and may require increased power consumption.

Now, some configurations of the switching device 1 that provide better characteristics than the reference examples described above will be presented by way of a plurality of practical examples. Unless otherwise stated or unless incompatible, any part of the description given above in connection with the embodiment is applicable to the practical examples described below. For any description of the practical examples that contradicts what has been described above, that description given in connection with the practical examples can prevail. Unless incompatible, any description given in connection with any of the plurality of practical examples described below is applicable to any other of the practical examples (that is, any two or more of the practical examples can be combined together).

Practical Example EX1_A

Practical Example EX1_A will be described. In Practical Example EX1_A, the reference voltage $V_{REF}$ has a waveform of a triangular wave, and in addition the reference voltage $V_{REF}$ is modulated such that the frequency of the triangular wave varies. FIG. 13 shows the waveform 610 of the reference voltage $V_{REF}$ in Practical Example EX1_A. In this embodiment, what the reference voltage generation circuit 10 generates is actually the reference voltage $V_{REF}$ in the Practical Example EX1_A.

In Practical Example EX1_A, the range of variation of the reference voltage $V_{REF}$ is from a predetermined lower-limit voltage $V_{L\_REF}$ to a predetermined upper-limit voltage $V_{H\_REF}$ higher than the lower-limit voltage $V_{L\_REF}$. The reference voltage generation circuit 10 of Practical Example EX1_A performs triangular wave generation unit operation as described below. In the triangular wave generation unit operation, starting in a state where the reference voltage $V_{REF}$ is made equal to the predetermined lower-limit voltage $V_{L\_REF}$, the reference voltage generation circuit 10 of Practical Example EX1_A increases the reference voltage $V_{REF}$ from the lower-limit voltage $V_{L\_REF}$ to the upper-limit voltage $V_{H\_REF}$ linearly and monotonically with an increase gradient U REF; when the reference voltage $V_{REF}$ reaches the upper-limit voltage $V_{H\_REF}$, the reference voltage generation circuit 10 reverses the direction of change of the reference voltage $V_{REF}$ from the increasing direction to the decreasing direction; thereafter, the reference voltage generation circuit 10 of Practical Example EX1_A decreases the reference voltage $V_{REF}$ from the upper-limit voltage $V_{H\_REF}$ to the lower-limit voltage $V_{L\_REF}$ linearly and monotonically with a decrease gradient $D_{\_REF}$.

One cycle of the triangular wave generation unit operation is an operation in which, starting in a state where the reference voltage $V_{REF}$ is made equal to the predetermined lower-limit voltage $V_{L\_REF}$, the reference voltage $V_{REF}$ is increased monotonically and then decreased monotonically until the reference voltage $V_{REF}$ returns to the lower-limit voltage $V_{L\_REF}$. The reference voltage generation circuit 10 of Practical Example EX1_A repeatedly performs the triangular wave generation unit operation described above. Specifically, when, in the ith cycle of the triangular wave generation unit operation, the reference voltage $V_{REF}$, starting at the lower-limit voltage $V_{L\_REF}$, increases monotonically and then decreases monotonically until it returns to the lower-limit voltage $V_{L\_REF}$, the reference voltage generation circuit 10 ends the ith cycle of the triangular wave generation unit operation and subsequently starts the (i+1)th cycle of the triangular wave generation unit operation. Here, i represents any natural number.

Here, for the sake of convenience, the period in which one cycle of the triangular wave generation unit operation is performed will be referred to as the triangular wave unit period and the triangular wave unit period in which the ith cycle of the triangular wave generation unit operation is performed will be identified by the symbol "P[i]".

In each cycle of the triangular wave generation unit operation, the magnitudes of the increase and decrease gradients $U_{\_REF}$ and $D_{\_REF}$ are equal. That is, in the ith cycle of the triangular wave generation unit operation (in other words, in the triangular wave unit period P[i]), the increase and decrease gradients $U_{\_REF}$ and $D_{\_REF}$ are equal; in the (i+1)th cycle of the triangular wave generation unit operation (in other words, in the triangular wave unit period P[i+1]), the increase and decrease gradients $U_{\_REF}$ and $D_{\_REF}$ are equal. The same applies to any other cycle of the triangular wave generation unit operation.

Note however that, for any natural number i, the increase and decrease gradients $U_{\_REF}$ and $D_{\_REF}$ in the (i+1)th cycle of the triangular wave generation unit operation differ from the increase and decrease gradients $U_{\_REF}$ and $D_{\_REF}$ in the ith cycle of the triangular wave generation unit operation. That is, for any natural number i, the length of the triangular wave unit period P[i+1] differs from the length of the triangular wave unit period P[i], and thus the frequency of the triangular wave in the reference voltage $V_{REF}$ varies.

Here, as the possible lengths of triangular wave unit periods, a total of n lengths T[1] to T[n] are defined previously. Here, n is any integer of two or more. For any natural number j, the length T[j+1] is longer than the length T[j]. As shown in FIG. 14, starting in a state where the length of the triangular wave unit period equals the length T[1], every time one triangular wave unit period elapses, the length of the triangular wave unit period is increased to T[2], T[3], . . . , T[n−1], and T[n]. When the triangular wave unit period with the length T[n] ends, then every time one triangular wave unit period elapses, the length of the triangular wave unit period is decreased to T[n−1], T[n−2], . . . , T[2], and T[1]. This is repeated thereafter.

In this way, in the reference voltage generation circuit 10, operation proceeds as follows: every time one triangular wave unit period elapses, the length of the triangular wave unit period is increased stepwise from the length T[1] to T[2], T[3], . . . , T[n−1], and T[n]; thereafter, every time one triangular wave unit period elapses, the length of the triangular wave unit period is decreased stepwise from the length T[n] to T[n−1], T[n−2], . . . , T[2], and T[1]. This operation is repeated thereafter.

In the following description, the frequency of the triangular wave in the reference voltage $V_{REF}$ will occasionally be referred to as the frequency $f_{REF}$. The frequency $f_{REF}$ can be understood as the frequency of the reference voltage $V_{REF}$. With focus on the frequency $f_{REF}$, operation can be understood to proceed as follows: in the reference voltage generation circuit 10, every time one triangular wave unit period elapses, the frequency $f_{REF}$ of the triangular wave is decreased stepwise from the frequency 1/T[1] to the frequency 1/T[2], 1/T[3], . . . , 1/T[n−1], and 1/T[n]; thereafter, every time one triangular wave unit period elapses, the frequency $f_{REF}$ of the triangular wave is increased stepwise from the frequency 1/T[n] to the frequency 1/T[n−1], 1/T [n−2], . . . , 1/T[2], and 1/T[1]. This operation is repeated thereafter. For any natural number j, the length T[j+1] is longer than the length T[j]; thus the frequency 1/T[1] corresponds to the maximum frequency in the range of variation of the frequency $f_{REF}$, and the frequency 1/T[n] corresponds to the minimum frequency in the range of variation of the frequency $f_{REF}$.

For example, in a case where n=3, the lengths T[1], T[2], and T[3] can be set at 1/120000 seconds, 1/100000 seconds, and 1/80000 seconds respectively. In this case, the frequency $f_{REF}$ of the triangular wave varies among 120 kHz, 100 kHz, and 80 kHz. As a result of the reference voltage $V_{REF}$ being modulated, the frequency $f_{S1}$ of the signal S1 varies. Here, the center frequency and the minimum frequency of the range of variation of the frequency $f_{S1}$ of the signal S1 are significantly (e.g., ten times or several tens of times) higher than the maximum frequency (i.e., 1/T[1]) of the range of variation of the frequency $f_{REF}$ of the triangular wave. This can be achieved by appropriately setting the characteristics (increase gradient $U_{RAMP}$, decrease gradient $D_{RAMP}$, lower-limit voltage $V_{L\_RAMP}$, and upper-limit voltage $V_{H\_RAMP}$) of the ramp voltage $V_{RAMP}$.

Sharply changing the frequency $f_{REF}$ of the triangular wave (e.g., changing the frequency $f_{REF}$ of the triangular wave from the frequency 1/T[n] to the frequency 1/T[1] at once) may invite inconvenience such as a strict requirement for fast response in circuit operation. To prevent this, the frequency $f_{REF}$ of the triangular wave is increased or decreased stepwise as described above.

While it is here assumed that, in each cycle of the triangular wave generation unit operation, the magnitudes of the increase and decrease gradients $U_{\_REF}$ and $D_{\_REF}$ are equal, a configuration is also possible where, in each cycle of the triangular wave generation unit operation, the magnitudes of the increase and decrease gradients $U_{\_REF}$ and $D_{\_REF}$ are different.

Figure 15:
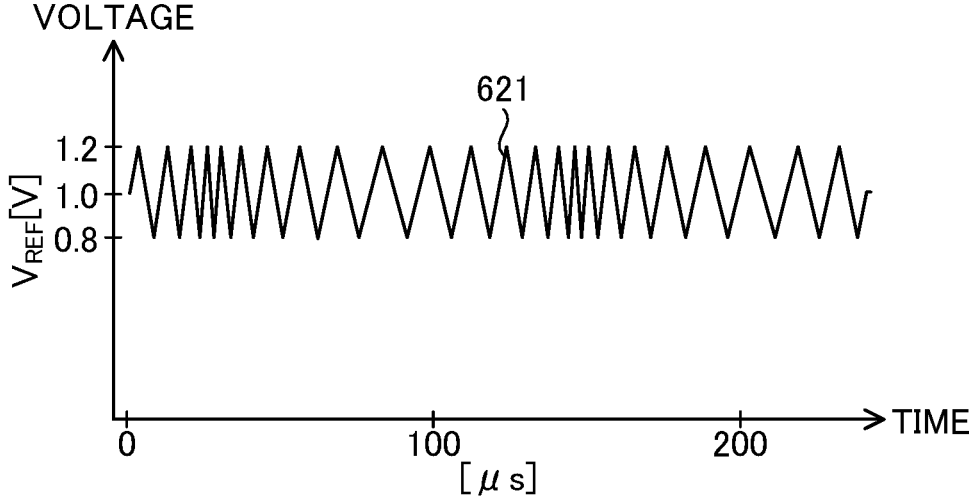
FIG. 15 is a diagram showing the time dependence of a reference voltage according to Practical Example EX1_A belonging to the first embodiment of the present disclosure.
Figure 16:
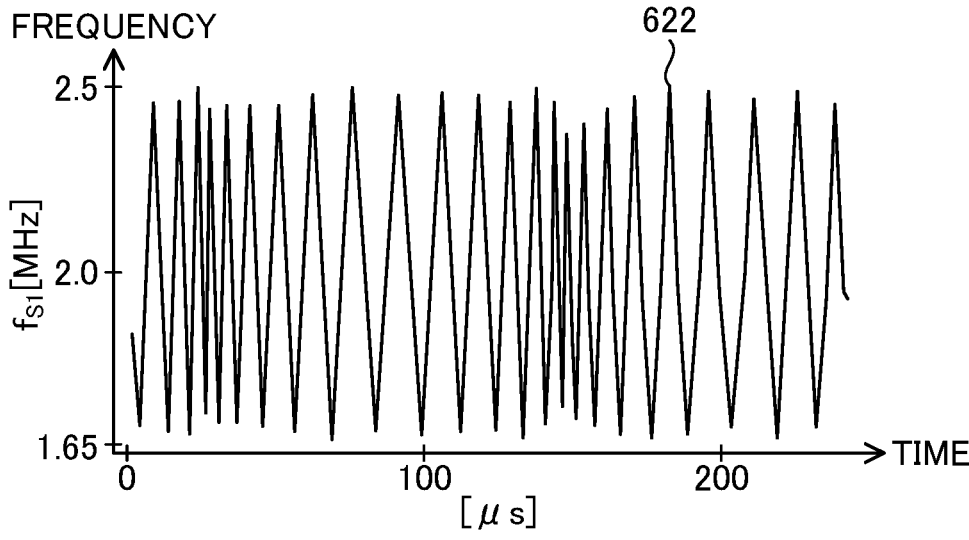
FIG. 16 is a diagram showing the time dependence of the frequency of a comparison result signal according to Practical Example EX1_A belonging to the first embodiment of the present disclosure.

In FIG. 15, a waveform 621 represents the time dependence of the reference voltage $V_{REF}$ in Practical Example EX1_A and, in FIG. 16, a waveform 622 represents the time dependence of the frequency $f_{S1}$ of the signal S1 in Practical Example EX1_A. It is here assumed that, in Practical Example EX1_A, the reference voltage $V_{REF}$ is a voltage with a triangular waveform that varies around 1.0 V (volt) between 0.8 V and 1.2 V and the frequency $f_{REF}$ of the triangular wave is modulated around 100 kHz (kilohertz). In the waveform 621 in FIG. 15, n=7. The lengths T[1], T[2], T[3], T[4], T[5], T[6], and T[7] are set at the reciprocals of 60, 80, 100, 120, 140, 160, and 180 kHz respectively.

Figure 17:
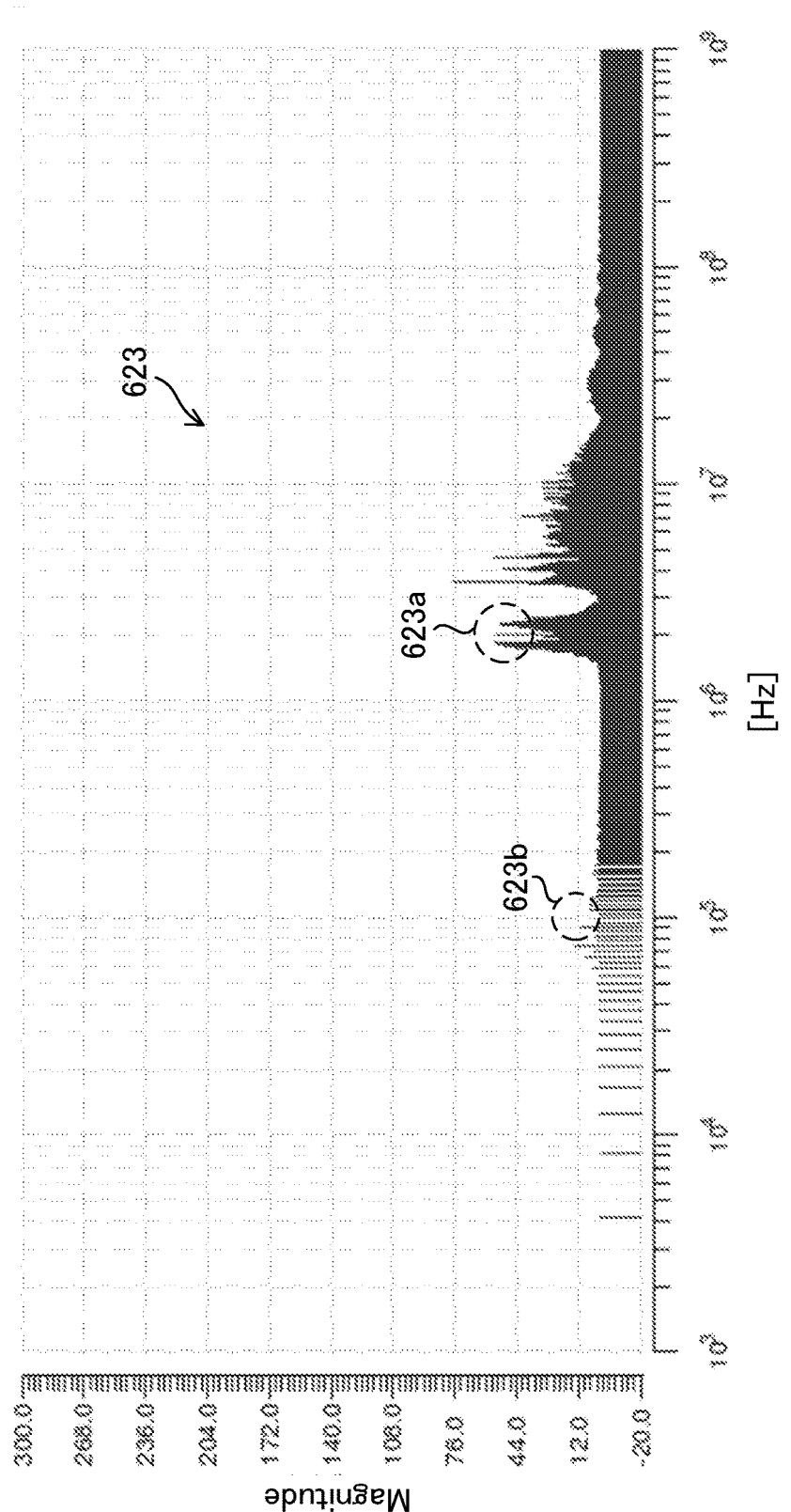
FIG. 17 is a diagram showing the frequency spectrum of a comparison result signal according to Practical Example EX1_A belonging to the first embodiment of the present disclosure.

FIG. 17 shows the frequency spectrum 623 of the signal S1 in Practical Example EX1_A. It reveals that, compared with Reference Example 1 (see FIG. 6), in Practical Example EX1_A, the spectrum of the signal S1 is spread, resulting in reduced peak intensities of the signal S1 in a high-frequency band (at 2.0 MHz and at frequencies that are integer multiples of 2.0 MHz). It also reveals that, compared with Reference Example 2, in Practical Example EX1_A, the spectrum of the signal S1 in the frequency band of the modulation of the reference voltage $V_{REF}$ (here, a band around 100 kHz) is spread, resulting in reduced noise in that frequency band (see the broken line-encircled part 923b in FIG. 11 and the broken line-encircled part 623b in FIG. 17). Moreover, in Practical Example EX1_A, as a result of the triangular wave in the reference voltage $V_{REF}$ being modulated, also the peak intensities of the signal S1 in a high-frequency band is further reduced compared with Reference Example 2 (see the broken line-encircled part 923a in FIG. 11 and the broken line-encircled part 623a in FIG. 17).

As described above, with Practical Example EX1_A, it is possible to reduce the peak intensities of noise ascribable to the signal S1 (the noise in the signal S1 itself and the switching noise from the switching transistor 50 based on the signal S1) both in a high-frequency band (here, a band of 2.0 MHz or more) and in a low-frequency band (here, a band around 100 kHz).

Practical Example EX1_B

Figure 18:
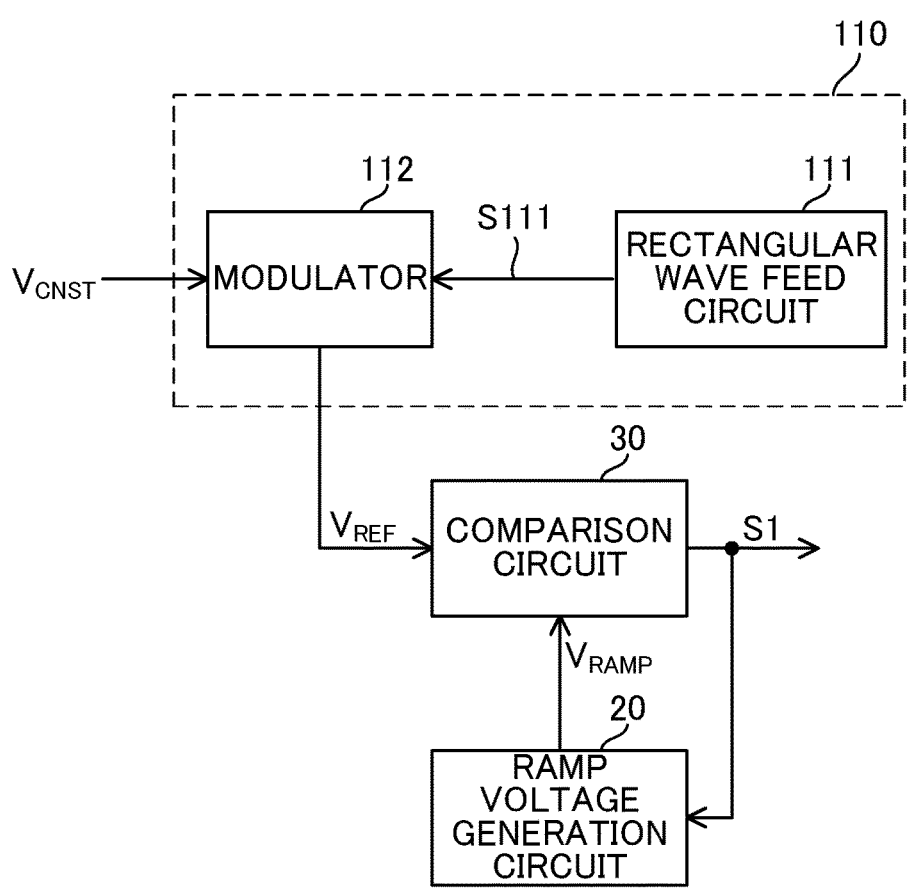
FIG. 18 is a diagram showing an example of the internal configuration of a reference voltage generation circuit according to Practical Example EX1_B belonging to the first embodiment of the present disclosure.

Practical Example EX1_B will be described. FIG. 18 shows a configuration example of a reference voltage generation circuit 110 in Practical Example EX1_B. The Practical Example EX1_B is implemented in combination with Practical Example EX1_A described above, and the reference voltage generation circuit 110 is used as the reference voltage generation circuit 10 in the Practical Example EX1_A. That is, the reference voltage generation circuit 110 is one example of the reference voltage generation circuit 10 in Practical Example EX1_A.

The reference voltage generation circuit 110 includes a rectangular wave feed circuit 111 and a modulator 112. The rectangular wave feed circuit 111 generates n different rectangular-wave signals with n mutually different frequencies respectively to output a signal S111 resulting from combining together those n different rectangular-wave signals. The signal S111 is fed to the modulator 112.

Figure 19:
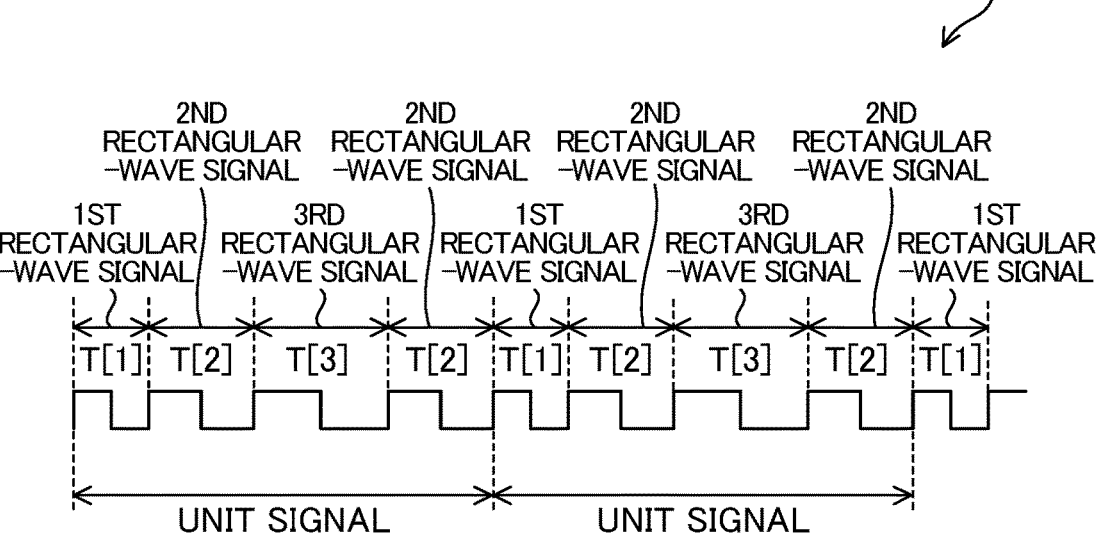
FIG. 19 is a diagram showing an example of the waveform of the output signal of the rectangular wave feed circuit in FIG. 18 according to Practical Example EX1_B belonging to the first embodiment of the present disclosure.

FIG. 19 schematically shows the waveform of the signal S111 as observed when n=3. The signal S111 is a signal resulting from combining together a first rectangular-wave signal with a period equal to a length T[1], a second rectangular-wave signal with a period equal to a length T[2], a third rectangular-wave signal with a period equal to a length T[3], . . . , and an nth rectangular-wave signal with a period equal to a length T[n]. The first to nth rectangular-wave signals each takes, as its signal level, high and low levels alternately. It is here assumed that each rectangular-wave signal has a duty of 50%. That is, in each rectangular-wave signal, the ratio between the high-level period and the low-level period is 1:1. It is also assumed that the cycle of each rectangular-wave signal starts with a high-level period.

In the signal S111, every time one period of a rectangular-wave signal elapses, which of the different rectangular-wave signals to incorporate in the signal S111 changes.

One period of the first rectangular-wave signal, one period of the second rectangular-wave signal, one period of the third rectangular-wave signal, . . . , one period of the (n−1)th rectangular-wave signal, one period of the nth rectangular-wave signal, one period of the (n−1)th rectangular-wave signal, . . . , one period of the third rectangular-wave signal, and one period of the second rectangular-wave signal are combined together in this order chronologically to serve as a unit signal, and this unit signal is repeated to form the signal S111. Accordingly, in a case where n=3, as shown in FIG. 19, one period of the first rectangular-wave signal, one period of the second rectangular-wave signal, one period of the third rectangular-wave signal, and one period of the second rectangular-wave signal are combined together in this order chronologically to serve as a unit signal, and this unit signal is repeated to form the signal S111.

As described above, the frequency of the rectangular-wave signals incorporated into the unit signal mentioned above first decreases gradually from the maximum frequency (the reciprocal of the length T[1]) to the minimum frequency (the reciprocal of the length T[n]) and then increases gradually from the minimum frequency (the reciprocal of the length T[n]) to the maximum frequency.

The modulator 112 is fed with a predetermined direct-current voltage $V_{CNST}$. The direct-current voltage $V_{CNST}$ has a fixed constant voltage. The modulator 112, by modulating the direct-current voltage $V_{CNST}$ based on the signal S111, generates the reference voltage $V_{REF}$, which has the characteristics described in connection with Practical Example EX1_A (see FIG. 13).

Figure 20:
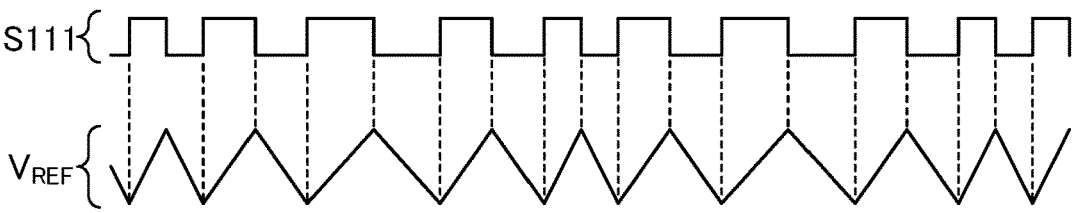
FIG. 20 is a diagram showing an example of the relationship of the output signal of the rectangular wave feed circuit in FIG. 18 with a reference voltage according to Practical Example EX1_B belonging to the first embodiment of the present disclosure.

FIG. 20 schematically shows the waveforms of the signal S111 and the reference voltage $V_{REF}$ as observed in a case where n=3. The modulator 112 modulates the direct-current voltage $V_{CNST}$ based on the signal S111 such that, in the high-level period of the signal S111, the reference voltage $V_{REF}$ increases linearly and monotonically with the predetermined increase gradient $U_{\_REF}$ and that, in the low-level period of the signal S111, the reference voltage $V_{REF}$ decreases linearly and monotonically with the predetermined decrease gradient $D_{\_REF}$. In this way the modulator 112 generates the reference voltage $V_{REF}$.

The modulator 112 makes the magnitudes of the increase and decrease gradients $U_{\_REF}$ and $D_{\_REF}$ in the period in which, as the signal S111, the ith rectangular-wave signal is fed to the modulator 112 proportional to the reciprocal of the length T[i]. That is, the modulator 112 sets the magnitudes of the increase and decrease gradients $U_{\_REF}$ and $D_{\_REF}$ in the period in which, as the signal S111, the first rectangular-wave signal is fed to the modulator 112 to $(1/T[1]) \times k_B$, and sets the magnitudes of the increase and decrease gradients $U_{\_REF}$ and $D_{\_REF}$ in the period in which, as the signal S111, the second rectangular-wave signal is fed to the modulator 112 to $(1/T[2]) \times k_B$. Since $T[1] < T[2]$, $(1/T[1]) \times k_B > (1/T[2]) \times k_B$. A similar description applies to the period in which, as the signal S111, the third rectangular-wave signal or the like is fed to the modulator 112. In this way, the reference voltage $V_{REF}$ with the characteristics described in connection with Practical Example EX1_A is obtained. Here, $k_B$ is a predetermined constant of proportion.

Figure 21:
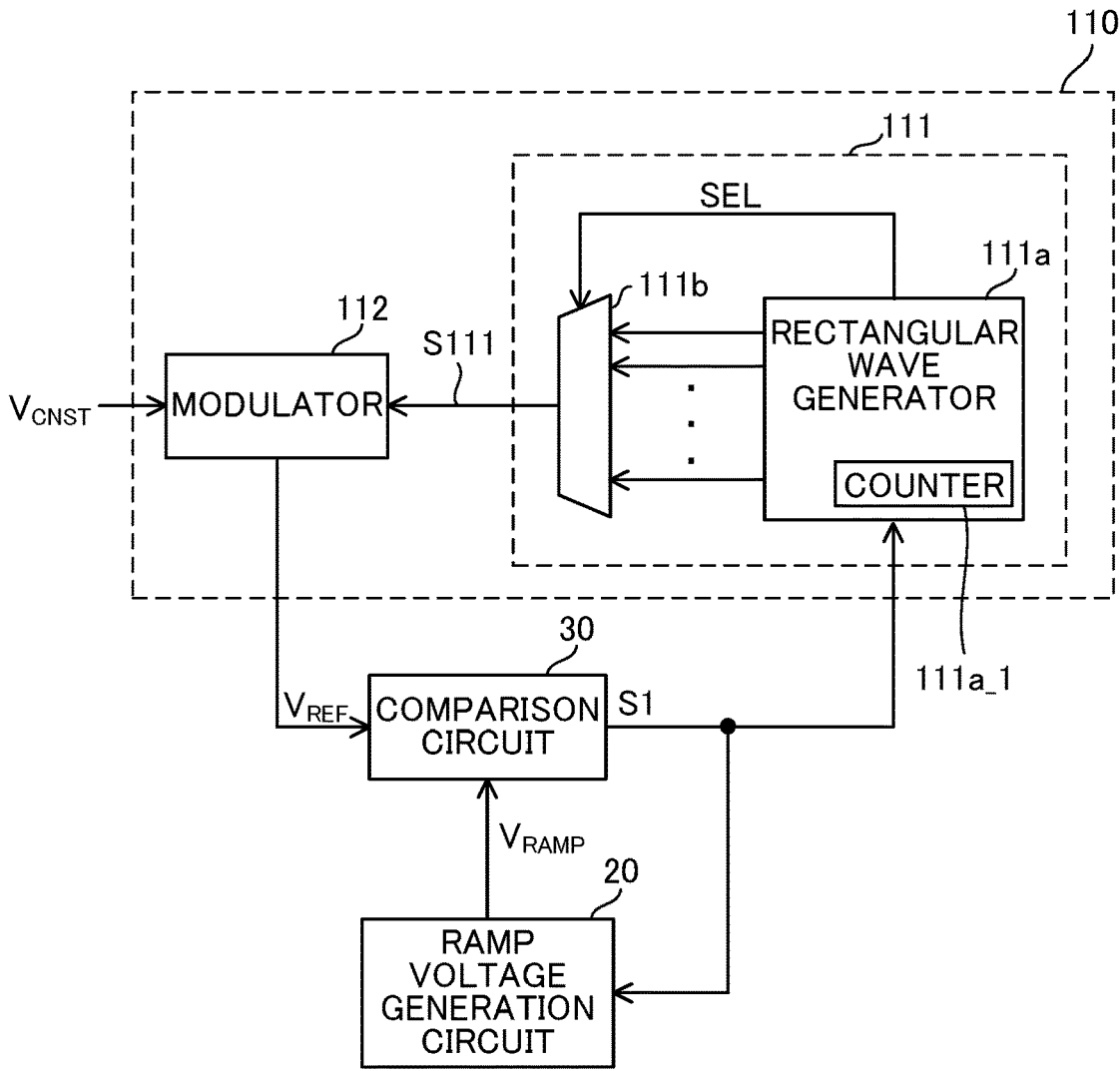
FIG. 21 is a diagram showing an example of the internal configuration of the rectangular wave feed circuit in FIG. 18.

As shown in FIG. 21, the rectangular wave feed circuit 111 can be configured with a rectangular wave generator 111a and a selector 111b. The rectangular wave generator 111a is fed with the signal S1. The rectangular wave generator 111a includes a counter 111a_1 that counts the number of times that an up edge occurs in the signal S1. The rectangular wave generator 111a generates the first to nth rectangular-wave signals by dividing the frequency of the signal S1 by n different division factors based on the count value of the counter 111a_1. The selector 111b outputs the signal S111 based on the first to nth rectangular-wave signals. The selector 111b selects one of the first to nth rectangular-wave signals based on a selection signal SEL fed from the rectangular wave generator 111a, and outputs the selected rectangular-wave signal as the signal S111. Here, the rectangular wave generator 111a can generate the selection signal SEL based on the above-mentioned count value such that the signal S111 with the characteristics described above (e.g., a signal S111 with the characteristics in FIG. 19) is output from the selector 111b. The selection signal SEL may be one fed to the selector 111b from a circuit other than the rectangular wave generator 111a.

Practical Example EX1_C

Figure 22:
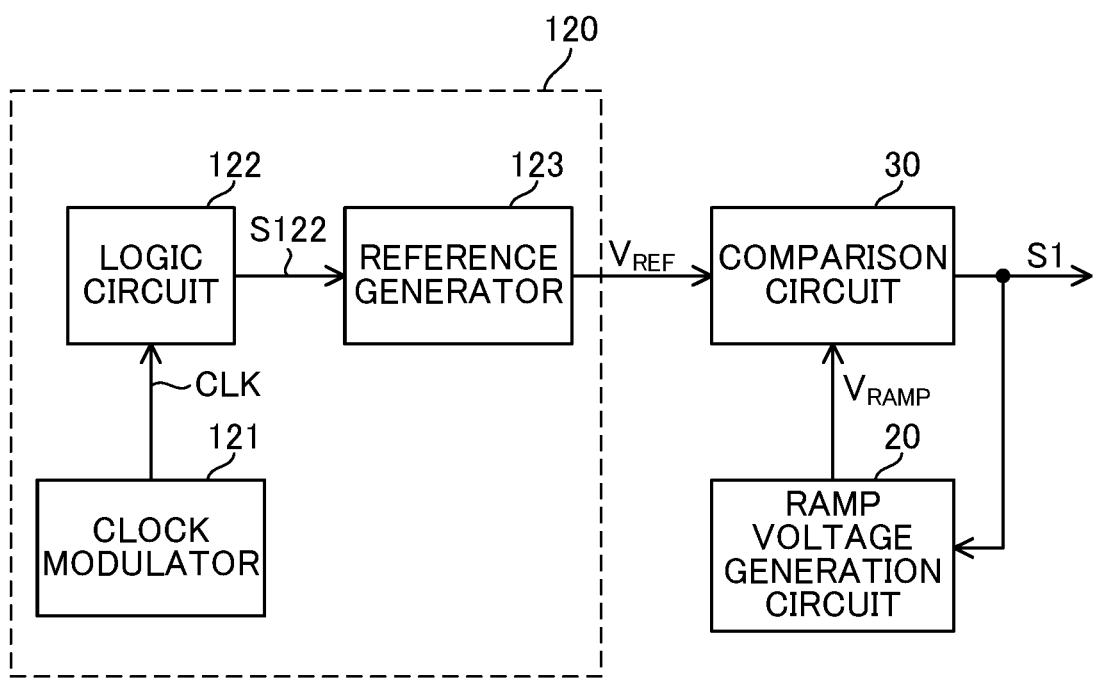
FIG. 22 is a diagram showing an example of the internal configuration of a reference voltage generation circuit according to Practical Example EX1_C belonging to the first embodiment of the present disclosure.

Practical Example EX1_C will be described. FIG. 22 shows a configuration example of a reference voltage generation circuit 120 according to Practical Example EX1_C. The Practical Example EX1_C is implemented in combination with Practical Example EX1_A described previously, and the reference voltage generation circuit 120 is used as the reference voltage generation circuit 10 in the Practical Example EX1_A. That is, the reference voltage generation circuit 120 is one example of the reference voltage generation circuit 10 in Practical Example EX1_A.

The reference voltage generation circuit 120 includes a clock modulator 121, a logic circuit 122, and a reference generator 123.

The clock modulator 121 includes a VCO, that is, a voltage-controlled oscillator, and the VCO generates a clock signal with a frequency corresponding to the input voltage to it. The clock signal is a rectangular-wave signal that takes, as its signal level, high and low levels alternately. The clock modulator 121 modulates the frequency of the clock signal (i.e., varies the frequency of a clock signal CLK, which will be described later) by variably controlling the input voltage to the VCO. The so modulated clock signal is, as a clock signal CLK, fed to the logic circuit 122. The logic circuit 122 feeds a control signal S112 based on the clock signal CLK to the reference generator 123. The reference generator 123 generates the reference voltage $V_{REF}$ corresponding to the control signal S112.

For example, the logic circuit 122 can divide the frequency of the clock signal CLK by a predetermined division factor and feed the divided clock signal CLK as a control signal S122 to the reference generator 123. In this case, the reference generator 123 generates the reference voltage $V_{REF}$ based on the control signal S122 such that the frequency $f_{REF}$ of the triangular wave in the reference voltage $V_{REF}$ is proportional to the frequency of the control signal S122.

Assuming that the logic circuit 122 divides the frequency of the clock signal CLK by a factor of two, some numerical examples will be presented. It is also assumed that the frequency $f_{REF}$ of the triangular wave in the reference voltage $V_{REF}$ is set at $k_C$ times the frequency of the control signal S122. The symbol $k_C$ represents a predetermined proportionality coefficient less than one (e.g., $k_C=1/100$). In this case, if the frequency of the clock signal CLK is 20 MHz, the frequency of the control signal S122 is 10 MHz, and thus the frequency $f_{REF}$ of the triangular wave is $(10 \times k_C)$ MHz. Likewise, if the frequency of the clock signal CLK is 18 MHz, the frequency of the control signal S122 is 9 MHz, and thus the frequency $f_{REF}$ of the triangular wave is $(9 \times k_C)$ MHz.

Thus, the frequency $f_{REF}$ of the triangular wave in the reference voltage $V_{REF}$ generated by the reference generator 123 depends on the frequency of the clock signal CLK. Using the clock signal CLK, which is a frequency-modulated clock signal, permits the frequency $f_{REF}$ of the triangular wave to be modulated. The modulated clock signal CLK can be generated such that the reference generator 123 generates the reference voltage $V_{REF}$ with the characteristics described in connection with Practical Example EX1_A.

For example, the reference generator 123 can make the magnitudes of the increase and decrease gradients $U_{\_REF}$ and $D_{\_REF}$ of the reference voltage $V_{REF}$ proportional to the frequency of the control signal S122, and in this way it is possible to obtain the frequency $f_{REF}$ of the triangular wave corresponding to the frequency of the clock signal CLK.

Second Embodiment

Figure 23:
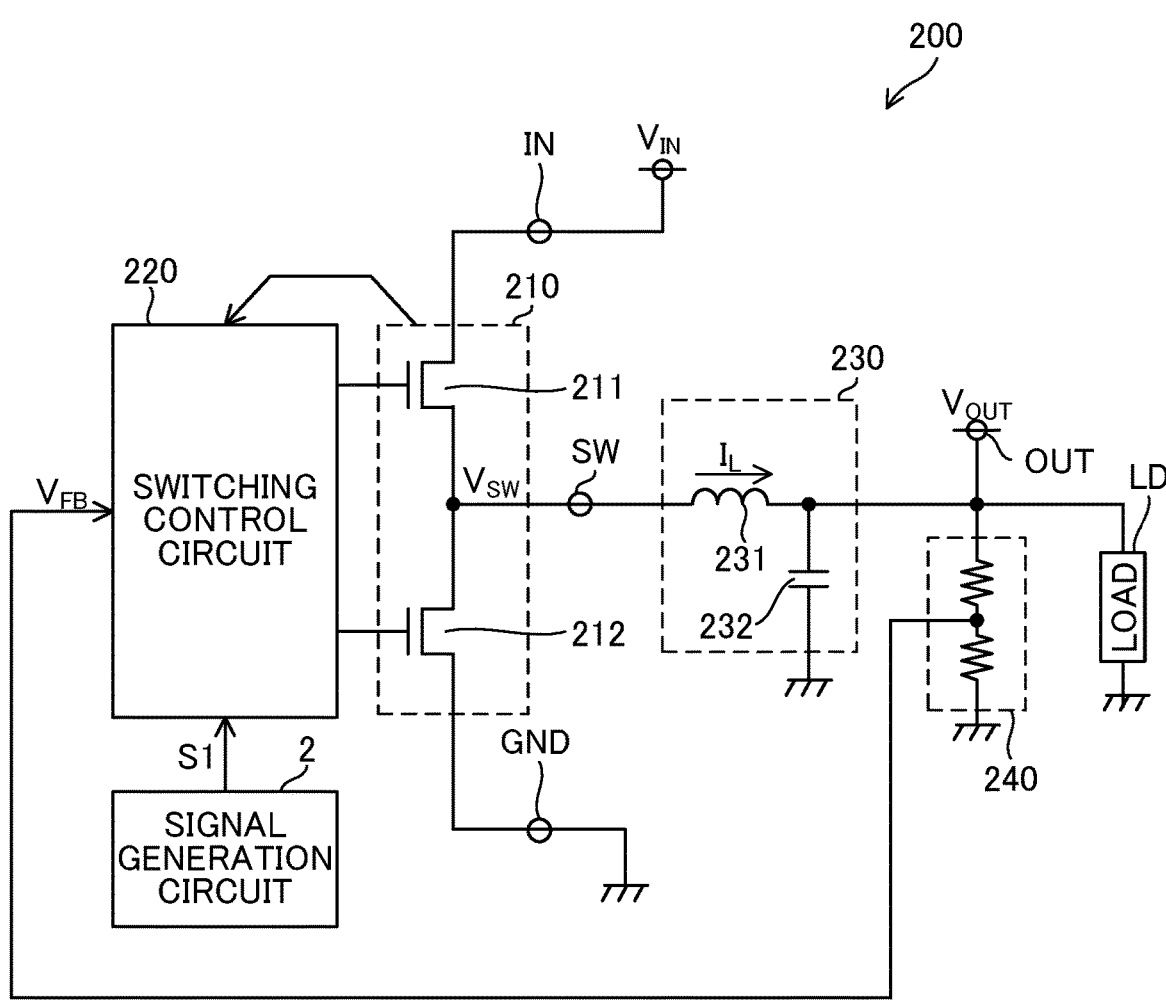
FIG. 23 is a configuration diagram of a switching power supply device according to a second embodiment of the present disclosure.

A second embodiment of the present disclosure will be described. The second embodiment is implemented in combination with the first embodiment. FIG. 23 is a configuration diagram of a switching power supply device 200 according to the second embodiment. The switching power supply device 200 is configured as a buck (step-down) DC-DC converter that performs power conversion on an input voltage $V_{IN}$ to generate an output voltage $V_{OUT}$ lower than the input voltage $V_{IN}$. The input voltage $V_{IN}$ and the output voltage $V_{OUT}$ are each a positive direct-current voltage. The switching power supply device 200 is provided with an input terminal IN fed with the input voltage $V_{IN}$, an output terminal OUT at which the output voltage $V_{OUT}$ appears, a ground terminal GND at a ground potential, and a switching terminal SW fed with a switching voltage $V_{SW}$, which will be described later. The ground terminal GND and the switching terminal SW are provided on the lower-potential side with respect to the input terminal IN.

The switching power supply device 200 includes the signal generation circuit 2 described in connection with the first embodiment, and further includes an output stage circuit 210, a switching control circuit 220, a rectifying-smoothing circuit 230, and a feedback voltage generation circuit 240. The signal generation circuit 2 in the switching power supply device 200 is identical with the signal generation circuit 2 (see FIG. 1) in the first embodiment. The signal generation circuit 2 in the switching power supply device 200 generates a reference voltage $V_{REF}$ with the characteristics described above in connection with Practical Example EX1_A, and by use of this reference voltage $V_{REF}$, the signal S1 is generated.

Figure 24:
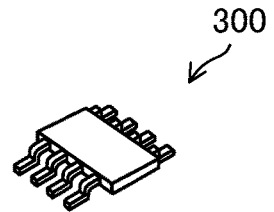
FIG. 24 is an exterior perspective view of a switching device according to the second embodiment of the present disclosure.

The switching power supply device 200 can be configured by use of a semiconductor device 300. FIG. 24 shows an example of the exterior appearance of the semiconductor device 300. The semiconductor device 300 is an electronic component that includes a semiconductor chip having a semiconductor integrated circuit formed on a semiconductor substrate, a package (case) housing the semiconductor chip, and a plurality of external terminals exposed out of the package to outside the semiconductor device 300. Sealing the semiconductor chip in the package (case) formed of resin yields the semiconductor device 300. The semiconductor integrated circuit can be configured to include the signal generation circuit 2, the output stage circuit 210, and the switching control circuit 220. Or it can be configured to include the signal generation circuit 2 and the switching control circuit 220. The feedback voltage generation circuit 240 may be provided inside the semiconductor device 300, or may be provided outside the semiconductor device 300.

The output stage circuit 210 includes a half-bridge circuit composed of a series circuit of a high-side transistor 211 and a low-side transistor 212. The rectifying-smoothing circuit 230 includes an inductor 231 and an output capacitor 232.

The switching power supply device 200 performs direct current-to-direct current conversion by synchronous rectification by use of the transistors 211 and 212. The transistors 211 and 212 are configured as N-channel MOSFETs. A modification is possible where the transistor 211 is configured as a P-channel MOSFET. Also possible is to replace the transistor 212 with a diode, in which case the switching power supply device 200 performs direct current-to-direct current conversion by asynchronous rectification.

The drain of the transistor 211 is connected to the input terminal IN, and is thus fed with the input voltage $V_{IN}$. The source of the transistor 211 and the drain of the transistor 212 are both connected to the switching terminal SW. The source of the transistor 212 is connected to the ground terminal GND (that is, it is connected to a ground). The voltage applied to the switching terminal SW will be referred to as the switching voltage and identified by the symbol "$V_{SW}$". The switching terminal SW is connected to one terminal of the inductor 231, and the other terminal of the inductor 231 is connected to the output terminal OUT. At the output terminal OUT appears the output voltage $V_{OUT}$. Between the output terminal OUT and the ground, the output capacitor 232 is connected.

In FIG. 23, the reference sign "LD" identifies a load connected between the output terminal OUT and the ground. The load LD can be any load that operates based on the output voltage $V_{OUT}$. The current that passes through the inductor 231 is referred to as the inductor current and identified by the symbol "$I_L$".

The feedback voltage generation circuit 240 generates a division voltage of the output voltage $V_{OUT}$ by using a series circuit of a plurality of resistors arranged between the output terminal OUT and the ground, and feeds the generated division voltage as a feedback voltage $V_{FB}$ to the switching control circuit 220. The output voltage $V_{OUT}$ itself may be used as the feedback voltage $V_{FB}$, in which case the feedback voltage generation circuit 240 is omitted from the switching power supply device 200.

The switching control circuit 220 controls and sets the state of the output stage circuit 210 to one of a high-output state, a low-output state, and a both-off state. In the high-output state, the transistor 211 is on and the transistor 212 is off. In the low-output state, the transistor 211 is off and the transistor 212 is on. In the both-off state, the transistors 211 and 212 are both off. The transistors 211 and 212 are never both be on.

The switching control circuit 220 performs switching control by turning the transistors 211 and 212 on and off alternately (i.e., switches the state of the output stage circuit 210 between the high- and low-output states) based on information on the output voltage $V_{OUT}$ (i.e., the feedback voltage $V_{FB}$) and information on the inductor current $I_L$. The switching control circuit 220 thereby stabilizes the output voltage $V_{OUT}$ at a predetermined target voltage $V_{TG}$. That is, the switching control circuit 220 can drive the transistors 211 and 212 by what is called current-mode control. For example, the current that passes through the transistor 211 during the on period of the transistor 211 can be used as information on the inductor current $I_L$. In the switching control by the switching control circuit 220, turning the transistors 211 and 212 on and off alternately does not exclude the presence, during a transition between the low- and high-output states, of a both-off state with consideration given to a dead time or the like.

Through the switching control described above, a voltage with a rectangular waveform of which the level varies between substantially the level of the input voltage $V_{IN}$ and the level of the ground appears as the switching voltage $V_{SW}$.

The switching voltage $V_{SW}$ is rectified and smoothed by the rectifying-smoothing circuit 230 to produce the direct-current output voltage $V_{OUT}$.

The switching control circuit 220 determines the switching frequency of the transistors 211 and 212 based on the signal S1 output from the signal generation circuit 2. Specifically, the switching control circuit 220 repeats switching control in which it switches the state of the output stage circuit 210 from the low-output state to the high-output state synchronously with an up edge in the signal S1 (i.e., a switch of the value of the signal S1 from "0" to "1") and thereafter switches the state of the output stage circuit 210 from the high-output state to the low-output state based on another signal (not illustrated). The just-mentioned other signal is generated by the switching control circuit 220 based on information on the output voltage $V_{OUT}$ (i.e., the feedback voltage $V_{FB}$) and information on the inductor current $I_L$. That is, the switching control circuit 220 controls the switching frequency of the transistors 211 and 212 based on the signal S1 and controls the output duty based on the above-mentioned other signal. The output duty denotes the ratio of the period in which the output stage circuit 210 is in the high-output state to the sum of the period in which the output stage circuit 210 is in the high-output state and the period in which the output stage circuit 210 is in the low-output state. Thus, the switching control by the switching control circuit 220 corresponds to PWM (pulse-width modulation) control.

The switching control circuit 220 is one example of the switching control circuit 40 in FIG. 1. In other words, the switching control circuit 220 includes the switching control circuit 40 in FIG. 1. With attention paid to the fact that the transistor 211 is turned on by the switching control circuit 220 synchronously with an up edge in the signal S1, the transistor 211 corresponds to the switching transistor 50 in FIG. 1, and the PWM control by the switching control circuit 220 achieves the switching operation of the transistor 211. With attention paid to the fact that the transistor 212 is turned off by the switching control circuit 220 synchronously with an up edge in the signal S1, the transistor 212 corresponds to the switching transistor 50 in FIG. 1, and the PWM control by the switching control circuit 220 achieves the switching operation of the transistor 212.

The above description discusses controlling the state of the output stage circuit 210 by current-mode control based on information on the output voltage $V_{OUT}$ (i.e., the feedback voltage $V_{FB}$) and information on the inductor current $I_L$. The switching control circuit 220 may instead employ a method of controlling the state of the output stage circuit 210 based on information on the output voltage $V_{OUT}$ (i.e., the feedback voltage $V_{FB}$) without referring to information on the inductor current $I_L$.

While the above description deals with a switching power supply device 200 configured as a buck DC-DC converter, the switching power supply device 200 may be configured as a boost (step-up) DC-DC converter or a boost/buck DC-DC converter.

Third Embodiment

A third embodiment of the present disclosure will be described. The third embodiment deals with applied or modified technologies that are applicable to the first or second embodiment described previously.

Low noise is strongly desired in power supply devices for generating a supply voltage for a vehicle-mounted radar device. In particular, high noise in a low-frequency band (e.g., a band around 100 kHz) may have adverse effects on different aspects of the performance (e.g., sensing accuracy) of a vehicle-mounted radar device. For this reason, the switching power supply device 200 according to the second embodiment is suitable as a power supply device for a vehicle-mounted radar device. That is, the load LD in FIG. 23 can be a vehicle-mounted radar device.

Note however that, in the present disclosure, the load LD is not limited to a vehicle-mounted radar device. The load LD may be any sensor device that is not classified as a radar device, or any electronic device. The switching power supply device 200 is particularly useful as a power supply device for any load LD that requires low noise (in particular, for example, low noise in a low-frequency band).

For any signal or voltage, the relationship between its high and low levels may be reversed from what is described above so long as that does not contradict the technical concept of what is disclosed herein.

Unless any inconvenience arises, any of the transistors mentioned above may be of any type. For example, unless any inconvenience arises, any transistor mentioned above as a MOSFET may be replaced with a junction FET, an IGBT (insulated-gate bipolar transistor), or a bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

In the present disclosure, whenever a first physical quantity and a second physical quantity are mentioned to be equal, that allows for an error. That is, whenever a first physical quantity and a second physical quantity are mentioned to be equal, it means that designing or manufacturing is done with an aim of making the first and second physical quantities equal; thus even if in reality there is an error between the first and second physical quantities, these are to be understood to be equal. This applies likewise to anything other than physical quantities.

Embodiments of the present disclosure can be modified in many ways as necessary without departure from the scope of the technical concepts defined in the appended claims. The embodiments described herein are merely examples of how the present disclosure can be implemented, and what is meant by any of the terms used to describe the subject matter of the present disclosure and its constituent elements is not limited to that mentioned in connection with the embodiments. The specific values mentioned in the above description are merely illustrative and needless to say can be modified to different values.

<<Notes>>

To follow are supplementary notes on what is disclosed herein.

According to one aspect of the present disclosure, a signal generation circuit includes: a reference voltage generation circuit configured to generate a reference voltage; a ramp voltage generation circuit configured to generate a ramp voltage that varies within a predetermined voltage range; and a comparison circuit configured to output a comparison result signal that indicates the magnitude relationship between the reference voltage and the ramp voltage. The reference voltage generation circuit gives the reference voltage a waveform of a triangular wave and varies the frequency of the triangular wave. (A first configuration.)

In the signal generation circuit of the first configuration described above, the comparison circuit may produce a particular change in the comparison result signal when the ramp voltage transits from a state lower than the reference voltage to a state higher than the reference voltage. The ramp voltage generation circuit may repeatedly perform unit operation in which the ramp voltage generation circuit increases the ramp voltage from a predetermined lower-limit voltage monotonically with a predetermined increase gradient and, when the particular change occurs in the comparison result signal, the ramp voltage generation circuit decreases the ramp voltage toward the lower-limit voltage monotonically with a predetermined decrease gradient. (A second configuration.)

In the signal generation circuit of the first configuration described above, the comparison circuit may produce a particular change in the comparison result signal when the ramp voltage transits from a state higher than the reference voltage to a state lower than the reference voltage. The ramp voltage generation circuit may repeatedly perform unit operation in which the ramp voltage generation circuit decreases the ramp voltage from a predetermined upper-limit voltage monotonically with a predetermined decrease gradient and, when the particular change occurs in the comparison result signal, the ramp voltage generation circuit increases the ramp voltage toward the upper-limit voltage monotonically with a predetermined increase gradient. (A third configuration.)

In the signal generation circuit of any of the first to third configurations described above, the reference voltage generation circuit may generate the reference voltage by modulating a predetermined direct-current voltage by sequentially using a plurality of rectangular-wave signals with mutually different frequencies. (A fourth configuration.)

In the signal generation circuit of any of the first to third configurations described above, the reference voltage generation circuit may vary the frequency of the triangular wave by giving the triangular wave in the reference voltage a frequency corresponding to the frequency of a clock signal and modulating the frequency of the clock signal. (A fifth configuration.)

According to another aspect of the present disclosure, a switching device includes: the signal generation circuit of any of the first to fifth configurations described above; a switching transistor; and a switching control circuit configured to switch the switching transistor based on the comparison result signal. (A sixth configuration.)

According to yet another aspect of the present disclosure, a switching device includes: the signal generation circuit of the second or third configuration described above; a switching transistor; and a switching control circuit configured to switch the switching transistor based on the comparison result signal. The switching control circuit turns on or off the switching transistor in response to the particular change in the comparison result signal. (A seventh configuration.)

In the switching device of the seventh configuration described above, the switching control circuit may repeat switching operation in which, in response to the particular change in the comparison result signal, the switching control circuit switches the switching transistor from one to the other of the on and off states and thereafter, in response to the fulfillment of a predetermined condition, the switching control circuit switches the switching transistor from the other back to the one of the on and off states. (An eighth configuration.)

According to still another aspect of the present disclosure, a switching power supply device configured to generate an output voltage from an input voltage includes: the switching device of the eighth configuration described above. The switching transistor is arranged between a terminal to which the input voltage is applied and a terminal provided on the lower-potential side with respect to the terminal to which the input voltage is applied. Through the switching operation, the input voltage is subjected to power conversion to produce the output voltage. (A ninth configuration.)

The invention claimed is:

1. A signal generation circuit, comprising: a reference voltage generation circuit configured to generate a reference voltage; a ramp voltage generation circuit configured to generate a ramp voltage that varies within a predetermined voltage range; and a comparison circuit configured to output a comparison result signal that indicates a magnitude relationship between the reference voltage and the ramp voltage, wherein the reference voltage generation circuit gives the reference voltage a waveform of a triangular wave and varies a frequency of the triangular wave, wherein the comparison circuit produces a particular change in the comparison result signal when the ramp voltage transits from a state lower than the reference voltage to a state higher than the reference voltage, and the ramp voltage generation circuit repeatedly performs unit operation in which the ramp voltage generation circuit increases the ramp voltage from a predetermined lower-limit voltage monotonically with a predetermined increase gradient and, when the particular change occurs in the comparison result signal, the ramp voltage generation circuit decreases the ramp voltage toward the lower-limit voltage monotonically with a predetermined decrease gradient.

2. A switching device, comprising:
the signal generation circuit according to claim 1;
a switching transistor; and
a switching control circuit configured to switch the switching transistor based on the comparison result signal.

3. A switching device, comprising:
the signal generation circuit according to claim 1;
a switching transistor; and
a switching control circuit configured to switch the switching transistor based on the comparison result signal,
wherein
the switching control circuit turns on or off the switching transistor in response to the particular change in the comparison result signal.

4. The switching device according to claim 3, wherein
the switching control circuit repeats switching operation in which, in response to the particular change in the comparison result signal, the switching control circuit switches the switching transistor from one to the other of on and off states and thereafter, in response to fulfillment of a predetermined condition, the switching control circuit switches the switching transistor from the other back to the one of the on and off states.

5. A switching power supply device configured to generate an output voltage from an input voltage, comprising:
the switching device according to claim 4,
wherein
the switching transistor is arranged between a terminal to which the input voltage is applied and a terminal provided on a lower-potential side with respect to the terminal to which the input voltage is applied, and
through the switching operation, the input voltage is subjected to power conversion to produce the output voltage.

6. A signal generation circuit, comprising: a reference voltage generation circuit configured to generate a reference voltage; a ramp voltage generation circuit configured to generate a ramp voltage that varies within a predetermined voltage range; and a comparison circuit configured to output a comparison result signal that indicates a magnitude relationship between the reference voltage and the ramp voltage, wherein the reference voltage generation circuit gives the reference voltage a waveform of a triangular wave and varies a frequency of the triangular wave, wherein the comparison circuit produces a particular change in the comparison result signal when the ramp voltage transits from a state higher than the reference voltage to a state lower than the reference voltage, and the ramp voltage generation circuit repeatedly performs unit operation in which the ramp voltage generation circuit decreases the ramp voltage from a predetermined upper-limit voltage monotonically with a predetermined decrease gradient and, when the particular change occurs in the comparison result signal, the ramp voltage generation circuit increases the ramp voltage toward the upper-limit voltage monotonically with a predetermined increase gradient.

7. A switching device, comprising: the signal generation circuit according to claim 6; a switching transistor; and a switching control circuit configured to switch the switching transistor based on the comparison result signal.

8. A switching device, comprising: the signal generation circuit according to claim 6; a switching transistor; and a switching control circuit configured to switch the switching transistor based on the comparison result signal, wherein the switching control circuit turns on or off the switching transistor in response to the particular change in the comparison result signal.

9. The switching device according to claim 8, wherein the switching control circuit repeats switching operation in which, in response to the particular change in the comparison result signal, the switching control circuit switches the switching transistor from one to the other of on and off states and thereafter, in response to fulfillment of a predetermined condition, the switching control circuit switches the switching transistor from the other back to the one of the on and off states.

10. A switching power supply device configured to generate an output voltage from an input voltage, comprising: the switching device according to claim 9, wherein the switching transistor is arranged between a terminal to which the input voltage is applied and a terminal provided on a lower-potential side with respect to the terminal to which the input voltage is applied, and through the switching operation, the input voltage is subjected to power conversion to produce the output voltage.

11. A signal generation circuit, comprising: a reference voltage generation circuit configured to generate a reference voltage; a ramp voltage generation circuit configured to generate a ramp voltage that varies within a predetermined voltage range; and a comparison circuit configured to output a comparison result signal that indicates a magnitude relationship between the reference voltage and the ramp voltage, wherein the reference voltage generation circuit gives the reference voltage a waveform of a triangular wave and varies a frequency of the triangular wave, wherein the reference voltage generation circuit generates the reference voltage by modulating a predetermined direct-current voltage by sequentially using a plurality of rectangular-wave signals with mutually different frequencies.

12. A switching device, comprising: the signal generation circuit according to claim 11; a switching transistor; and a switching control circuit configured to switch the switching transistor based on the comparison result signal.

13. A signal generation circuit, comprising: a reference voltage generation circuit configured to generate a reference voltage; a ramp voltage generation circuit configured to generate a ramp voltage that varies within a predetermined voltage range; and a comparison circuit configured to output a comparison result signal that indicates a magnitude relationship between the reference voltage and the ramp voltage, wherein the reference voltage generation circuit gives the reference voltage a waveform of a triangular wave and varies a frequency of the triangular wave, wherein the reference voltage generation circuit varies the frequency of the triangular wave by giving the triangular wave in the reference voltage a frequency corresponding to a frequency of a clock signal and modulating the frequency of the clock signal.

14. A switching device, comprising: the signal generation circuit according to claim 13; a switching transistor; and a switching control circuit configured to switch the switching transistor based on the comparison result signal.

* * * * *